(12) United States Patent  
Onodera

(10) Patent No.: US 6,335,889 B1  
(45) Date of Patent: Jan. 1, 2002

(54) SEMICONDUCTOR MEMORY DEVICE

(75) Inventor: Tadashi Onodera, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/688,797

(22) Filed: Oct. 17, 2000

(30) Foreign Application Priority Data

Oct. 18, 1999 (JP) ............................................ 11-295938

(51) Int. Cl.[7] ................................................ G11C 7/00
(52) U.S. Cl. .................................. 365/221; 365/230.04
(58) Field of Search ........................... 365/221, 230.04, 365/230.09, 219

(56) References Cited

U.S. PATENT DOCUMENTS

| | | | | |
|---|---|---|---|---|
| 5,602,780 A | * | 2/1997 | Diem | 365/230.05 |
| 6,122,208 A | * | 9/2000 | Stark | 365/219 |
| 6,134,180 A | * | 10/2000 | Kim | 365/233 |

* cited by examiner

Primary Examiner—A. Zarabian  
(74) Attorney, Agent, or Firm—Foley & Lardner

(57) ABSTRACT

A semiconductor memory device is disclosed that is capable of outputting in the fastest possible time the first of serial data that are read in bursts, despite the increase in capacity of a memory cell array. In this semiconductor memory device, for a single address access, a plurality of bits of serial data are read in a burst from a memory sub-array that is made up by memory cell arrays 11U$o$ and 11U$e$ or memory cell arrays 11L$e$ and 11L$o$. In order that the serial data that are read first are the data of bit 0 regardless of the operation mode of the semiconductor memory device, each individual memory sub-array is divided between portions for even data and portions for odd data and the even memory cell arrays 11U$e$ and 11L$e$ in which the data of bit 0 are stored are arranged closer to the data amplifier than the odd memory cell arrays 11U$o$ and 11L$o$. The maximum length of I/O lines that are used in reading even data is therefore about half that of the maximum length of I/O lines that are used in reading odd data.

17 Claims, 15 Drawing Sheets

SEMICONDUCTOR MEMORY DEVICE

BACKGROUND OF THE INVENTION

1. Field of the Invention

The present invention relates to a semiconductor memory device that performs data input to and data output from memory cells in bursts, and particularly to a semiconductor memory device that is provided with an operation mode in which data that are read from memory cells are outputted to the outside without being latched.

2. Description of the Related Art

In recent years, the operating speed of CPUs (Central Processing Units) has been increasing with each year along with the miniaturization of LSI (Large-Scale Integrated circuits). However, in spite of the increase in storage capacity of semiconductor memory devices such as DRAM (Dynamic Random Access Memory), the fact remains that greater memory capacity is accompanied by a corresponding increase in the wiring length, and the speed of these memory devices lags behind CPU speeds due to the delay resulting from the charging and discharging of word lines and bit lines.

This state has led to the implementation of various designs to realize an apparent increase in speed of the semiconductor memory device. One method that has been considered is using serial exchange of data with the outside of the semiconductor memory device while using parallel transfer of data between memory cells and other circuits inside the semiconductor memory device. Alternatively, it is possible to apply a DDR (Double Data Rate) technique by which input and output of data are performed at both the rise and fall of the basic clocks in the system that uses the semiconductor memory device, whereby input and output data are divided between two phases, the input and output operations of each phase are performed by parallel processing in the semiconductor memory device, and an internal processing period that corresponds to double the data input/output period is secured for the input/output data of each phase.

This type of semiconductor memory device may also be provided with several modes when reading serial data to the outside of the semiconductor memory device. As one of these modes, there is a mode in which, after once latching all bits of parallel data that have been simultaneously read from memory cells, the latched parallel data are then serially outputted to the outside (hereinbelow referred to as "latch mode"). In addition to this latch mode, there is a mode in which, to enable a shorter access time than that of latch mode, only the bit of the read parallel data that are to be outputted to outside the semiconductor memory device first are outputted "through" without latching (hereinbelow referred to as "through mode").

FIG. 1 gives a schematic representation of the internal architecture adopted in a semiconductor memory device of the prior art. An explanation is next given of the operation when reading in bursts is performed from the memory cell arrays shown in this figure. A read address that is supplied from outside the semiconductor memory device is assumed to correspond to, for example, memory cells inside memory cell array 101U. In this case, the data of, for example, 8 bits (bit 0-bit 7) corresponding to the designated read address are read in parallel from memory cell array 101U and simultaneously supplied to data amplifier 107U. Data amplifier 107U supplies the four bits of even data to parallel-serial conversion circuit 108Ue and the four bits of odd data to parallel-serial conversion circuit 108Uo.

Parallel-serial conversion circuit 108Ue converts the even data to four bits of serial data by sequentially outputting the received even data to selector 109e in synchronization with the fall of basic clock CLK. Parallel-serial conversion circuit 108Uo similarly converts the odd data to four bits of serial data by sequentially outputting the received odd data to selector 109o in synchronization with the rise of basic clocks CLK. Since data are read from memory cells 101U as described in the foregoing explanation, selectors 109e and 109o select serial data that are supplied from parallel-serial conversion circuits 108Ue and 108Uo in accordance with selection signals U/L.

Multiplexer 110 selects the output of selectors 109e and 109o at the rise of and fall, respectively, of basic clocks CLK, and alternately outputs even data and odd data. The eight bits of serial data from bit 0 to bit 7 are thus outputted to the outside in a burst through an output buffer (not shown in the figure) and input/output pad 100. In addition, read operations from memory cell array 101L are also carried out according to the above-described operation, data in this case being sent through data amplifier 107L and parallel-serial conversion circuits 108Le and 108Lo and from selectors 109e and 109o to multiplexer 110. Since the operation of writing to the memory cell arrays is not directly related to the problem to be solved, explanation is here omitted.

Thus, even if operations take place in accordance with a high-speed clock outside the semiconductor memory device, the read or write process can be carried out inside the semiconductor memory device at a period of eight times this clock because eight bits of data can be outputted to the outside or received from the outside in one instance of reading or writing, as described hereinabove. To describe in more specific terms, the architecture of the read system may be composed of memory cell arrays 101U and 101L and data amplifiers 107U and 107L for low speed; and by: parallel-serial conversion circuits 108Ue, 108Uo, 108Le, and 108Lo; selectors 109e and 109o; multiplexer 110; and input/output pad 100 for high speed. In this case, the length of wiring of the latter path is shorter than that of the former, and there are fewer constituent elements on the latter path than on the former path. As a result, the use of larger transistors has little effect on the size of a chip, making this architecture readily applicable to high-speed operation.

In a typical general-purpose clock-synchronized DRAM, however, there is variation in the locations in the memory cell array or each of the bits of data that are to be read in parallel from the memory cell array. In other words, the locations of all of the bits are distributed over the entire memory cell array with no relation between the bits of parallel data that are read first and the bits that are read last. In the prior art, therefore, processing is carried out by slowing the CPU to match the processing speed of the DRAM. For example, if the CAS (Column Address Strobe) latency is set to "3," the CPU assigns the CAS signal to the DRAM and then waits "3 cycles" before receiving the read data from DRAM. Essentially, read time in the prior art is determined by the bit that takes the most time to read, thereby determining not only the specifications of the DRAM but the design of the system that uses the DRAM. Accordingly, the same level of high-speed access is demanded for all bits from bit 0 to bit 7 in a case in which eight bits of data are read in parallel from a memory cell array.

On the other hand, the type of semiconductor memory device that is taken as the object of the present invention has a fixed burst output as described hereinabove, and the data that are read from a memory cell array are sequentially outputted in a burst of, for example, an eight-bit portion from bit 0 to bit 7. This order of output depends on the various operation modes such as the above-described latch mode or through mode and does not change, and it is determined in advance as a specification that the bit that is to be outputted first is always bit 0.

Accordingly, in a semiconductor memory device having a fixed burst output, the demand for the reading of bit 0 is the most stringent regarding time, and the performance of the semiconductor memory device is governed by how fast this bit 0 is read. In particular, when the semiconductor memory device is operated in through mode, the data of bit 0 that is read from the memory cell array must be transferred "through" without latching to multiplexer 110 in the vicinity of input/output pad 100. As a result, the timing demand becomes more stringent with increased length of the read path.

In semiconductor memory devices of the prior art, however, consideration is given only to the access of all bits of parallel data within the same general time period, as with general-purpose DRAM, and these devices are not designed with consideration given to high-speed access with special attention to only bit 0. In other words, in semiconductor memory devices of the prior art, conditions regarding the location of each bit in each memory cell array are not taken into consideration, and a configuration is adopted in which even data and odd data are stored mixed within each memory cell array. In semiconductor memory devices of the prior art, for example, the only guarantee is that the access time of a memory cell located at the most remote end with respect to data amplifier 107U (for example, memory cell Cf shown in FIG. 1) will not exceed a prescribed permissible time.

As described above, there is a possibility in the semiconductor memory device of the prior art that the memory cell of bit 0 that is to be outputted first in burst reading is located at the position that is most remote from the data amplifier, as with memory cell Cf shown in FIG. 1, whereby more time will be required for the read data to reach data amplifier 107U than for a case in which the memory cell of bit 0 is located in the vicinity of data amplifier 107U, similar to memory cell Cn of the same figure. This increase in access time causes a problem for the operating speed characteristics.

Although the memory cell array in FIG. 1 is shown spreading in the horizontal direction for the sake of easy depiction, an actual memory cell array takes on a form that is spread out more in the vertical direction of the figure. As the capacity of a semiconductor memory device further increases in the future, moreover, the degree of vertical elongation will inevitably become more pronounced. For example, the length of memory cell array 101U or memory cell array 101L in the vertical direction of the figure (in other words, the distance that is substantially equal to the distance between memory cell Cn and memory cell Cf in FIG. 1) has reached the order of millimeters at the present time. The vertical dimension of the memory cell array is thus now 2 mm (=2000 $\mu$m), and, regarding characteristics, the I/O (input/output) lines connecting the data amplifier and sense amplifier (not shown in the figure) are assumed to have a capacitance of 1 pF per millimeter, a width of 1 $\mu$m, and a conductivity of 0.05$\Omega$ per unit of area.

According to these conditions, a 2-mm portion of wiring has a resistance of 100$\Omega$ and a time constant (CR) of approximately 200 ps. This 200 ps is nothing more than the estimated minimum delay when considering only the load of the I/O lines, and, depending on the conditions, the time constant may reach as high as 500 ps. Further, the load of the I/O lines increases and the delay time grows in proportion to increase in the scale of each memory cell array as the capacity of the semiconductor memory device is increased. If the various causes of delay other than the load of the I/O lines are all taken into consideration, including for example, the delay of the address system and the delay for a selection path to reach input/output pad 100 from data amplifier 107U, a total delay of nearly 1 ns is conceivable. Considering that the access time of current semiconductor memory devices is several ns, a delay of nearly 1 ns cannot be ignored.

Although even data and odd data are stored mixed within each memory cell array in the example shown in FIG. 1, another example may be considered in which only even data are stored in memory cell array 101U and only odd data are stored in memory cell array 101L. However, even when such a construction is adopted, the above-described problems still occur without change despite the minor alteration of the configuration of such components as the data amplifiers, write amplifiers, serial-parallel conversion circuits, and parallel-serial conversion circuits. The same problems occur because, in this configuration as well, memory cells such as memory cell Cf that are located at the most remote end with respect to data amplifier 107U still exist in memory cell array 101U, in which even data including bit 0 are stored.

Theoretically, a configuration other than the above-described configurations can also be considered in which each memory cell array is further divided so as to lighten the load of I/O lines, and peripheral circuits such as write amplifiers, data amplifiers, serial-parallel conversion circuits, and parallel-serial conversion circuits are provided for each of the subdivided memory cell arrays. However, the serial-parallel conversion circuits and parallel-serial conversion circuits constitute huge circuit blocks, and the adoption of such a configuration would only decrease the amount of space occupied by cells, making this configuration an extremely unrealistic solution.

SUMMARY OF THE INVENTION

The present invention was achieved in view of the above-described state and has as an object the provision of a semiconductor memory device that, despite increase in the size of each memory cell array that accompanies increased capacity of a semiconductor memory device, can output the first data of serial data that are read in bursts to the outside at high speed, and that can reduce the consumption of electrical power.

The semiconductor memory device of the present invention is a semiconductor memory device that is provided with an output means that sorts into a prescribed order a plurality of bits of data that have been read from a memory sub-array having a plurality of memory cells and continuously outputs to the outside; wherein memory cells in which bits of data that are to be outputted first are stored are arranged such that bits of data that are to be outputted first can be outputted to the output means in a shorter time than bits of data that are simultaneously outputted.

According to a first aspect, a memory sub-array is divided into a plurality of memory cell arrays; and of the plurality of bits of data, the bits of data that are to be outputted first are stored in a first memory cell array of the plurality of memory cell arrays; this first memory cell array being arranged closer to the output means than the other memory cell arrays.

The memory sub-array may be constituted by the first memory cell array and a second memory cell array; and regarding the plurality of bits of data that are to be read simultaneously, the bits of data that are to be outputted first may be stored in the first memory cell array and the remaining bits of data may be alternately stored in a prescribed order in the two memory cell arrays; and when reading, each of the bits of data may be alternately read from the first memory cell array and the second memory cell array and outputted continuously to the outside, with the first memory cell array, in which are stored the bits of data that are to be read first, being read first. Each of the bits of data that are alternately read from the first memory cell array and second memory cell array may be alternately outputted to the outside in synchronization with the rise and fall of clocks, and the bits of data that are to be outputted first may be read from the first memory cell array and transmitted "through" as far as the output terminal.

According to a second aspect, the length of a first output line, which is for reading from the memory sub-array the bits of data that are to be outputted first of the plurality of bits of data and transmitting to the output means, is shorter than other output lines for transmitting to the output means other bits of data that are simultaneously outputted.

The first output lines and the other output lines are hierarchical output lines that are made up by: local output lines onto which are read bits of data that are stored in the memory cells; and global output lines for transmitting to the output means bits of data that have been read onto the local output line; and the length of global output lines that make up the first output lines may be shorter than the length of global output lines that make up the other output lines.

Alternatively, the memory sub-array may be made up by a plurality of memory cell arrays; each of the memory cell arrays may be further made up by a plurality of memory cell plates; local output lines may be provided for each group of a prescribed number of memory cell plates that are arranged adjacent to each other; and global output lines may be arranged to lead from each of the groups of local output lines to the output means; or, local output lines may be provided for each memory cell plate, and global output lines may be provided to lead from each of the local output lines to the output means; and, of the plurality of local output lines for transmitting to global output lines bits of data that are simultaneously outputted, the local output lines for transmitting the bits of data that are to be outputted first are preferably arranged closest to the output means.

According to a third aspect, the memory sub-array is divided into a plurality of memory cell arrays, and at the time of reading the plurality of bits of data that are read, only those areas in which this plurality of bits of data are stored are activated and the prescribed bits of data are read.

The semiconductor memory device may be provided with a plurality of memory sub-arrays and the plurality of bits of data that are to be read may be stored in memory cell arrays of the plurality of memory sub-arrays; and at the time of reading this plurality of bits of data, only those memory sub-arrays in which the plurality of bits of data are stored may be simultaneously activated and the prescribed bits of data read; or, the plurality of bits of data that are to be read may be stored in the memory cell arrays of a single memory sub-array, and at the time of reading this plurality of bits of data, only the memory cell arrays in which this plurality of bits of data are stored are simultaneously activated and the prescribed bits of data are read; or, each of the plurality of memory cell arrays may be further divided into a plurality of areas that are independently activated, and at the time of reading the plurality of bits of data, only the areas of the memory cell arrays in which the plurality of bits of data are stored may be activated, and the prescribed bits of data read.

The above and other objects, features, and advantages of the present invention will become apparent from the following description based on the accompanying drawings which illustrate an example of a preferred embodiment of the present invention.

DETAILED DESCRIPTION OF THE PREFERRED EMBODIMENTS

Referring now to the accompanying drawings, an embodiment of the present invention is next described.

Explanation of the Circuit Configuration

Figure 2:
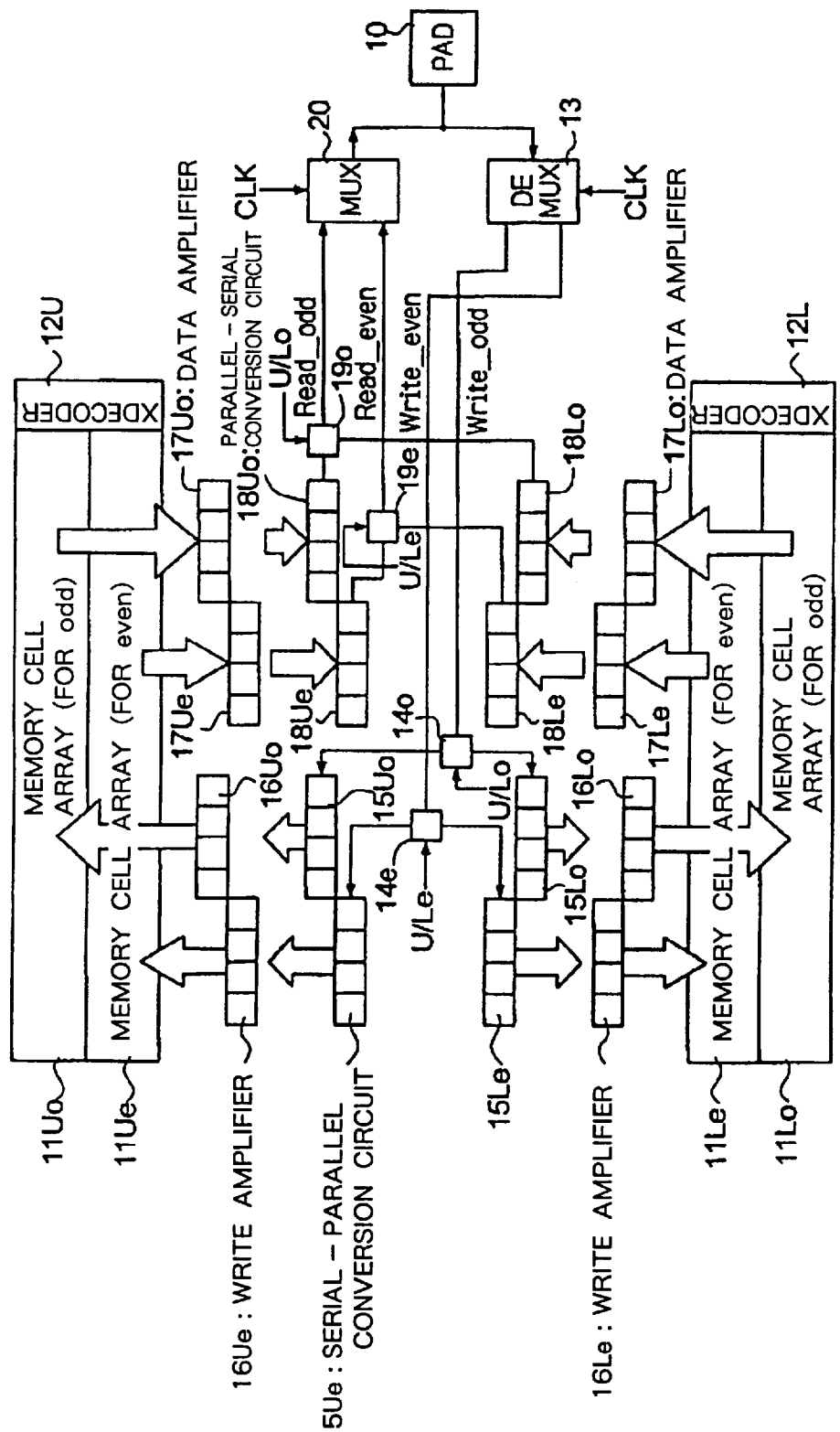
FIG. 2 is a block diagram showing the configuration of a semiconductor memory device according to an embodiment of the present invention.

Referring now to FIG. 2, which is a block diagram showing the configuration of the semiconductor memory device according to this embodiment, the configuration for one input/output pad (1DQ) is shown. In this figure, input/output pad ("PAD" in the figure) 10 is a terminal for performing input and output of serial data. By way of this input/output pad 10, serial data are continuously transferred between the semiconductor memory device and the outside in bursts of, for example, eight bits per address access in synchronization with basic clock CLK in a system that is applied to this semiconductor memory device. Thus, if the semiconductor memory device is operated at DDR (Double Data Rate), for example, data of the even bits composed of bits 0, 2, 4, and 6 (hereinbelow referred to as "even data") are transferred in synchronization with the rises of the basic clock, and data of the odd bits composed of bits 1, 3, 5, and 7 (hereinbelow referred to as "odd data") are transferred in synchronization with the falls of the basic clock. Data are transferred at input/output pad 10 in the order of bits 0, 1, 2, and so on to 7.

The operations described above are specifications that are stipulated strictly outside the semiconductor memory device, and no restrictions are placed inside the semiconductor memory device on whether even data and odd data are to be synchronized to the rise or fall of basic clock CLK, these factors being open to determination as appropriate based on considerations of ease of layout design or logical design. In other words, there is absolutely no impediment to making the timing inside the semiconductor memory device the exact opposite of the timing that is prescribed outside the semiconductor memory device. In this embodiment, explanation will proceed on the assumption that the transfer of even data and odd data between the semiconductor memory device and the outside is at the timing of rises and falls, respectively; while transfer of odd data and even data inside the semiconductor memory device is at the timing of rises and falls, respectively.

In the present embodiment, memory cell arrays 101U and 101L of the prior-art example are each constituted by two memory cell arrays, memory cell array 101U corresponding to memory cell arrays 11Ue and 11Uo and memory cell array 101L corresponding to memory cell arrays 11Le and 11Lo. Memory cell arrays 11Ue, 11Uo, 11Le, and 11Lo are each made up of a multiplicity of memory cells arranged in a matrix at the intersections of word lines and bit line pairs. When reading is performed from memory cell arrays 11Ue and 11Uo, for example, X-decoder (row decoder) 12U activates a word line in accordance with a row address that is contained within an address signal supplied from outside the semiconductor memory device and a Y-decoder (column decoder) that is not shown in the figure selects a bit line pair according to a column address that is contained in the same address signal, and the data of a prescribed memory cell are read from the selected bit line pair through sense amplifiers and column switches (not shown in the figure).

The same holds true for memory cell arrays 11Le and 11Lo, X-decoder 12L being used in place of X-decoder 12U in this case. In addition, the letters "U" and "L" in each reference numeral indicate "upper" and "lower," respectively; these labels being used because memory cell arrays 11Ue and 11Uo are located on the upper part of the figures, and memory cell arrays 11Le and 11Lo are located on the lower part of the figures. Furthermore, the four memory cell arrays shown in the figures are not all accessed at the same time, access at a particular time being directed to either of the memory cell arrays for even data or to either of the memory cell arrays for odd data (i.e., to two memory cell arrays).

As shown in the figure, the constructions that correspond to each of the memory cell arrays described in the prior art are divided between two memory cell arrays in the present embodiment. One of the divided memory cell arrays is an odd memory cell array for storing odd data and the other is an even memory cell array for storing even data. In the present embodiment, moreover, in order that the data of bit 0 that are outputted first in burst data be read as quickly as possible, a configuration is adopted in which the even memory cell arrays, which contain bit 0, are arranged closer to the data amplifier than the odd memory cell arrays. Furthermore, since the data amplifier is arranged close to input/output pad 10 for the purpose of shortening delay time, it may also be said that the even memory cell arrays are arranged closer to the input/output pad than the odd memory cell arrays.

To explain in still greater detail, the upper memory cell array is divided between even memory cell array 11Ue and odd memory cell array 11Uo, memory cell array 11Ue being arranged closer to the data amplifier than memory cell array 11Uo. Similarly, the lower memory cell arrays are also divided between even memory cell array 11Le and an odd memory cell array 11Lo, memory cell array 11Le being arranged closer to the data amplifier than memory cell array 11Lo. In the following explanation, the block made up by memory cell arrays 11Ue and 11Uo may be referred to as a "memory sub-array," and the block that is made up by memory cell arrays 11Le and 11Lo may similarly be referred to as a memory sub-array.

The memory cell arrays used in one address access can take one of two forms: the upper (or lower) portions are in the same block, or the upper (or lower) portions are in different blocks. In the former case, as in the prior art, even data and odd data are simultaneously read from memory cell arrays 11Ue and 11Uo, respectively, or even data and odd data are simultaneously read from memory cell arrays. 11Le and 11Lo, respectively. In this case, the row decode signals that are supplied from X-decoder 12U to memory cell arrays 11Ue and 11Uo are identical, and the row decode signals that are supplied from X-decoder 12L to memory cell arrays 11Le and 11Lo are also identical. From a different viewpoint, a single row decode signal is supplied from X-decoder 12U to both of memory cell arrays 11Ue and 11Uo, or a single row decode signal is supplied from X-decoder 12L to both memory cell arrays 11Le and 11Lo.

As a result, selection signals U/Le and U/Lo that respectively control the operation of selectors 19e and 19o, to be described hereinbelow, are signals for switching between the upper and lower portions. In a case in which 16 bits of data are read from the semiconductor memory device, for example, the most significant eight bits are first simultaneously read from upper memory cell arrays 11Ue and 11Uo, following which the least significant eight bits are simultaneously read from lower memory cell arrays 11Le and 11Lo. Because simultaneous access of differing memory sub-arrays can be considered in this embodiment, the selection signals are made independent of each other for the upper and lower portions.

In the latter case, in contrast, since access is performed to two memory sub-arrays, even data and odd data are simultaneously read from memory cell arrays 11U$e$ and 11L$o$, respectively, or even data and odd data are simultaneously read from memory cell arrays 11L$e$ and 11U$o$, respectively. Regarding the row decode signals that are supplied to the memory cell arrays in this case, the signal supplied from X-decoder 12U to memory cell array 11U$e$ is the same as the signal that is supplied from X-decoder 12L to memory cell array 11L$o$. Alternatively, the signal that is supplied from X-decoder 12U to memory cell array 11U$o$ is the same as the signal that is supplied from X-decoder 12L to memory cell array 11L$e$.

The selection signals U/L$e$ and U/L$o$ in the latter case, therefore, are not merely switch signals for the upper and lower portions such as described above, but are selection signals for distinguishing between the two memory cell arrays that make up each memory sub-array according to the access addresses. For example, when a 16-bit portion of data is to be read as described above, the first eight bits are simultaneously read from, for example, memory cell arrays 11U$e$ and 11L$o$, following which the remaining eight bits are simultaneously read from memory cell arrays 11U$o$ and 11L$e$.

Since there are cases in which the serial-parallel conversion circuits, write amplifiers, data amplifiers, and parallel-serial conversion circuits operate independently for even and odd portions, these components are each separated for even and odd use. In other words, not only are the serial-parallel conversion circuits divided between even serial-parallel conversion circuit 15U$e$ and odd serial-parallel conversion circuit 15U$o$ but between even serial-parallel conversion circuit 15L$e$ and odd serial-parallel conversion circuit 15L$o$. Further, the write amplifiers are divided between both even write amplifier 16U$e$ and odd write amplifier 16U$o$ and even write amplifier 16L$e$ and odd write amplifier 16L$o$. Still further, the data amplifiers are divided between both even data amplifier 17U$e$ and odd data amplifier 17U$o$ as well as between even data amplifier 17L$e$ and odd data amplifier 17L$o$. Finally, the parallel-serial conversion circuits are divided between even parallel-serial conversion circuit 18U$e$ and odd parallel-serial conversion circuit 18U$o$ as well as between even parallel-serial conversion circuit 18L$e$ and odd parallel-serial conversion circuit 18L$o$.

The circuits of the write system are next described. Demultiplexer 13 ("DEMUX" in the figure) first separates write data that are received serially by way of input/output pad 10 into even data and odd data ("Write_even" and "Write_odd" in the figures) in accordance with basic clock CLK. Received Write_even data are next supplied to demultiplexer 14$e$ and received Write_odd data are supplied to demultiplexer 14$o$. In other words, in accordance with the specifications inside the semiconductor memory device, demultiplexer 13 both begins to output each bit of even data from the fall of basic clocks CLK and holds until the next fall, and begins to output odd data from the rise of basic clocks CLK and holds until the next rise In accordance with the level of selection signals U/L$e$, demultiplexer 14$e$ supplies even data to serial-parallel conversion circuit 15U$e$ when writing to memory cell array 11U$e$ (selection signals U/L$e$ are, for example, "H" level) and supplies even data to serial-parallel conversion circuit 15L$e$ when writing to memory cell array 11L$e$ (selection signals U/L$e$ are, for example, "L" level). Demultiplexer 14$o$ functions similarly, and in accordance with selection signals U/Lo supplies odd data to serial-parallel conversion circuit 15U$o$ when writing to memory cell array 11U$o$ and supplies odd data to serial-parallel conversion circuit 15L$o$ when writing to memory cell array 11L$o$.

Serial-parallel conversion circuits 15U$e$ and 15L$e$ convert the four bits of even data that are serially received from demultiplexer 14$e$ to parallel data and supply these data to write amplifiers 16U$e$ and 16L$e$. Serial-parallel conversion circuits 15U$o$ and 15L$o$ function in the same way, and convert the four bits of odd data that are received from demultiplexer 14$o$ to parallel data and supply these data to write amplifiers 16U$o$ and 16L$o$, respectively.

Write amplifiers 16U$e$ and 16L$e$ simultaneously write the four bits of parallel data that are supplied from demultiplexer 14$e$ by way of serial-parallel conversion circuits 15U$e$ and 15L$e$ to four-bit portions of memory cells that are selected in memory cell arrays 11U$e$ and 11L$e$, respectively. Similarly, write amplifiers 16U$o$ and 16L$o$ simultaneously write the four bits of parallel data that are supplied from demultiplexer 14$o$ by way of serial-parallel conversion circuits 15U$o$ and 15L$o$ to the four-bit portion of memory cells that are selected in memory cell arrays 11U$o$ and 11L$o$.

Turning now to an explanation of the circuits of the read system, data amplifier 17U$e$ first amplifies the levels for the four bits of even data that are to be read simultaneously from memory cell array 11U$e$ and supplies the result to parallel-serial conversion circuit 18U$e$. In addition, data amplifier 17U$o$ amplifies the levels for the four bits of odd data that are to be simultaneously read from memory cell array 11U$o$ and supplies the results to parallel-serial conversion circuit 18U$o$. Similarly, data amplifiers 17L$e$ and 17L$o$ amplify the levels for even data to be simultaneously read from memory cell array 11L$e$ and odd data to be simultaneously read from memory cell array 11L$o$, respectively, and supply the results to parallel-serial conversion circuits 18L$e$ and 18L$o$, respectively.

In a case of reading from the same memory sub-array, the total of eight bits of parallel data that are outputted from data amplifiers 17U$e$ and 17U$o$, or the total of eight bits of parallel data that are outputted from data amplifiers 17L$e$ and 17L$o$, are the data that are used in a single burst of reading. In the case of reading from both memory sub-arrays, on the other hand, the total of eight bits of parallel data that are outputted from data amplifiers 17U$e$ and 17L$o$, or the total of eight bits of parallel data that are outputted from data amplifiers 17L$e$ and 17U$o$, are the data that are used in a single burst of reading.

Parallel-serial conversion circuits 18U$e$ and 18U$o$ convert the even data and odd data that are supplied from data amplifiers 17U$e$ and 17U$o$, respectively, to serial data and supply this result to selectors 19$e$ and 19$o$, respectively. Similarly, parallel-serial conversion circuit 18L$e$ and 18L$o$ convert the even data and odd data that are supplied from data amplifiers 17L$e$ and 17L$o$, respectively, to serial data and supply the result to selectors 19$e$ and 19$o$, respectively.

Selector 19$e$ distinguishes which of memory cell arrays 11U$e$ and 11L$e$ is the object of reading in accordance with selection signals U/L$e$, selects the even data that are serially supplied from parallel-serial conversion circuits 18U$e$ and 18L$e$ for each of these cases, and outputs to one of the input terminals of multiplexer 20. Selector 19$o$ similarly distinguishes which of memory cell arrays 11U$o$ and 11L$o$ is the object of reading in accordance with selection signals U/L$o$, selects the odd data that are serially supplied from parallel-serial conversion circuits 18U$o$ and 18L$o$ for each of these cases, and outputs to the other input terminal of multiplexer 20.

In accordance with the specifications inside the semiconductor memory device, multiplexer 20 ("MUX" in the figure) selects the even data and odd data ("Read_even" and "Read_odd" in the figure) that are serially supplied from selectors 19e and 19o, respectively, in synchronization with the rise and fall of basic clock CLK. In this way, even data and odd data are alternately outputted to input/output pad 10 by way of an output buffer (omitted in the figure). The output of this multiplexer 20 is then outputted out of the semiconductor memory device via input/output pad 10.

The foregoing explanation was given with regard to a construction for one input/output pad for transferring data. In an actual semiconductor memory device, however, as many as, for example, 16 input/output pads may be provided (16DQ), enabling the simultaneous input or output of 16 bits of data, whereby 16×8=128 bits of data may be transferred to or from the outside of the semiconductor memory device in a single burst operation.

In addition to input/output pads for realizing input/output of data to or from the semiconductor memory device, additional pads are of course provided for applying such signals as address signals; external clocks, these being clock signals outside the semiconductor memory device; and control signals; but these pads have been omitted to avoid complicating the drawings. In this connection, basic clock CLK may be the same as the external clock or may be generated inside the semiconductor memory device based on an external clock for phase adjustment. Normally, the latter alternative is adopted for phase adjustment.

In addition, the number of memory sub-arrays is not limited to two as shown in FIG. 2, and any number of memory sub-arrays may be provided according to the capacity of the semiconductor memory device. Thus, a construction that uses only the upper memory sub-array or a construction that uses only the lower memory sub-array is also possible, demultiplexers 14e and 14o and selectors 19e and 19o not being required in such cases. The following explanations will be presented based on a configuration that applies to one input/output pad and two memory sub-arrays such as shown in FIG. 2.

An actual example of the configuration of the serial-parallel conversion circuits, parallel-serial conversion circuits, and multiplexer shown in FIG. 2 and the details of their operation will be given following an explanation of the overall operation of the semiconductor memory device.

Control is performed when reading from and writing to memory sub-arrays such that only the minimum necessary circuits are operated. In a case of simultaneous reading from the two upper memory cell arrays, for example, the circuits of the lower reading system are not operated, and when simultaneously reading from the two lower memory cell arrays, the circuits of the upper reading system are not operated. Circuits relating to the odd data of the upper portion and circuits relating to the even data of the lower portion are not operated when even data and odd data are read from the upper and lower portions, respectively, and circuits relating to the even data of upper portion and circuits relating to the odd data of the lower portion are not operated when reading odd data and even data from the upper portion and lower portion, respectively.

Although it should be obvious, the write circuits do not operate during reading. In addition, the foregoing description also applies in its entirety to cases of writing to the memory sub-arrays. Furthermore, control of operations is exercised in accordance with control signals that are generated by a control circuit (not shown in the figure) that is provided in the semiconductor memory device. The selection signals such as U/Le and U/Lo that are shown in FIG. 2 are one type of these control signals and are generated by this control circuit. In the interest of avoiding complexity, only selection signals U/Le and U/Lo are shown as the control signals in FIG. 2.

Explanation of Layout

Figure 1:
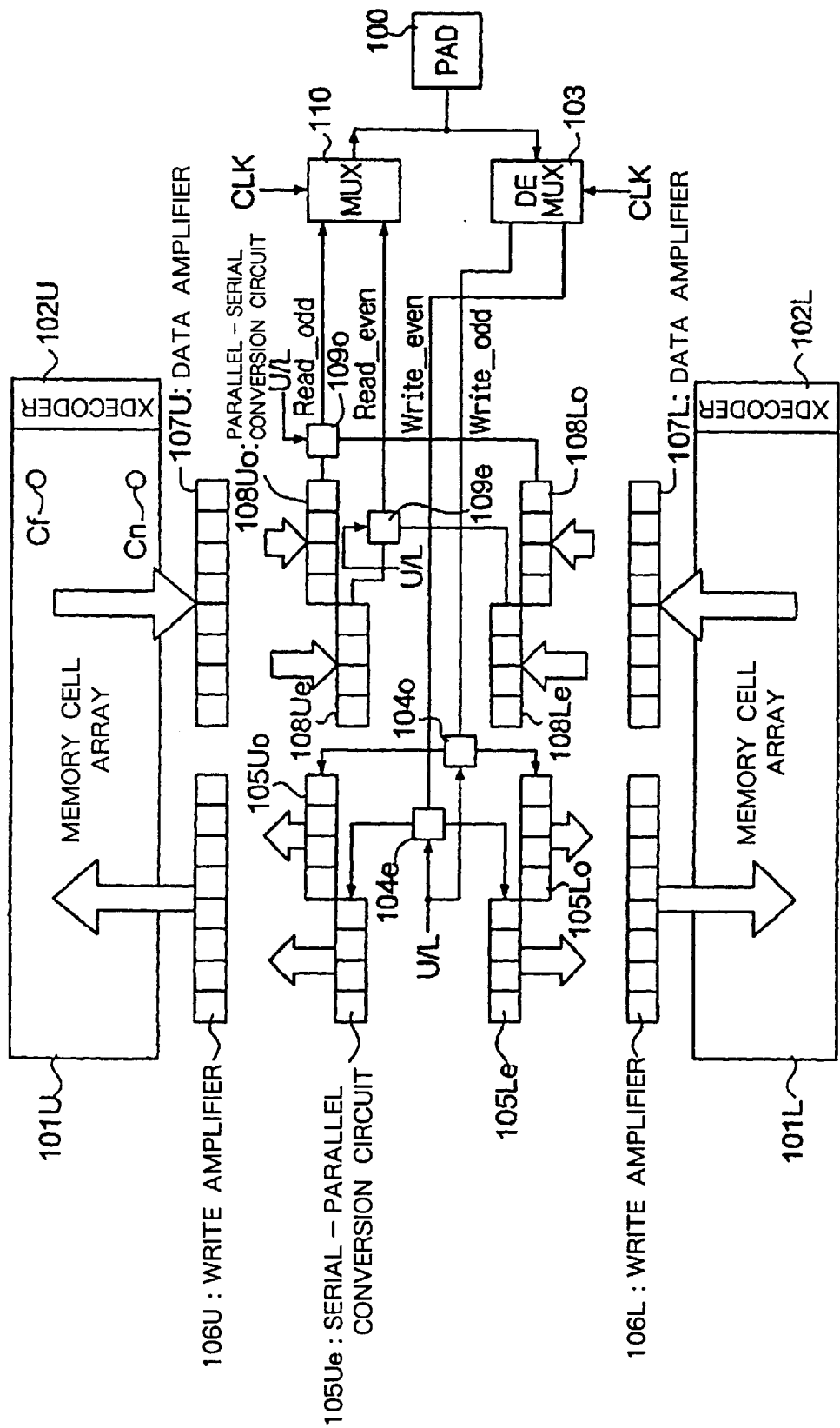
FIG. 1 is a block diagram showing the configuration of a semiconductor memory device according to the prior art.
Figure 3:
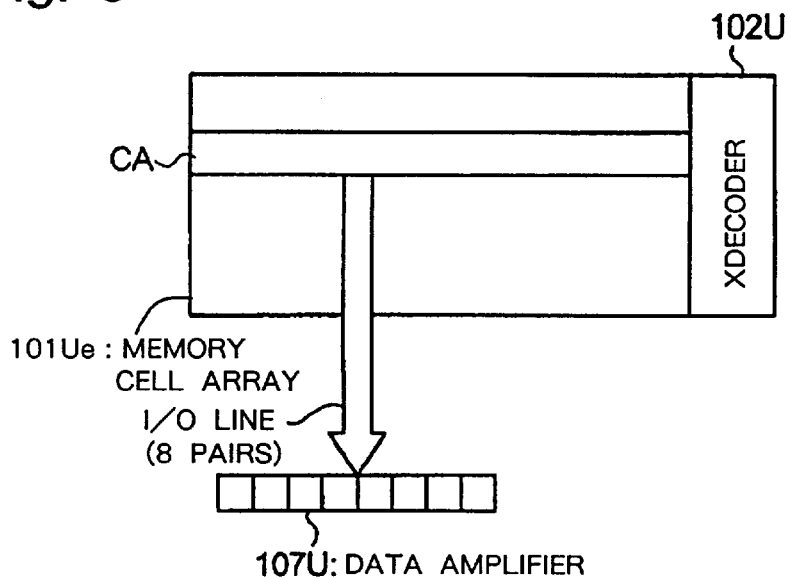
FIG. 3 is an explanatory view showing the reading of even data and odd data from a single memory cell array in the semiconductor memory device according to the prior art.

The mode of connecting I/O lines also has special features in the semiconductor memory device according to this embodiment. Turning our attention first to the length of the I/O lines, the maximum length of the I/O lines for transferring even data and the maximum length of the I/O lines for transferring odd data were the same in the semiconductor memory device of the prior art. FIG. 3 extracts only memory cell array 101U and data amplifier 107U in the semiconductor memory device according to the prior art shown in FIG. 1. The area in the memory cell array that is activated by X-decoder 102U with a single address access is the area indicated by the sign "CA" in the figure. In this case, eight I/O lines are used to simultaneously input or output the eight bits of data corresponding to one burst though an input/output pad (1DQ). The I/O lines may in some cases be True/Not pairs, and in such cases, eight pairs of I/O lines are used instead of eight I/O lines. The following explanations are presented on the assumption that the I/O lines are pairs.

As shown in the figure, the length of these eight pairs of I/O lines is the same for all bits whether they are for even data or for odd data. In addition, the maximum length is the distance from the position at which data amplifier 107U is arranged to the upper end of memory cell array 101U (the most remote end as seen from the data amplifier), and in the case of the above-described example of numerical values, the maximum length is approximately 2 mm. FIG. 3 shows only the signal lines (output lines) for reading, but the foregoing explanation holds true whether the signal lines for reading (output lines) are separate from the signal lines for writing (input lines) or the I/O lines for reading and writing are shared.

Figure 4:
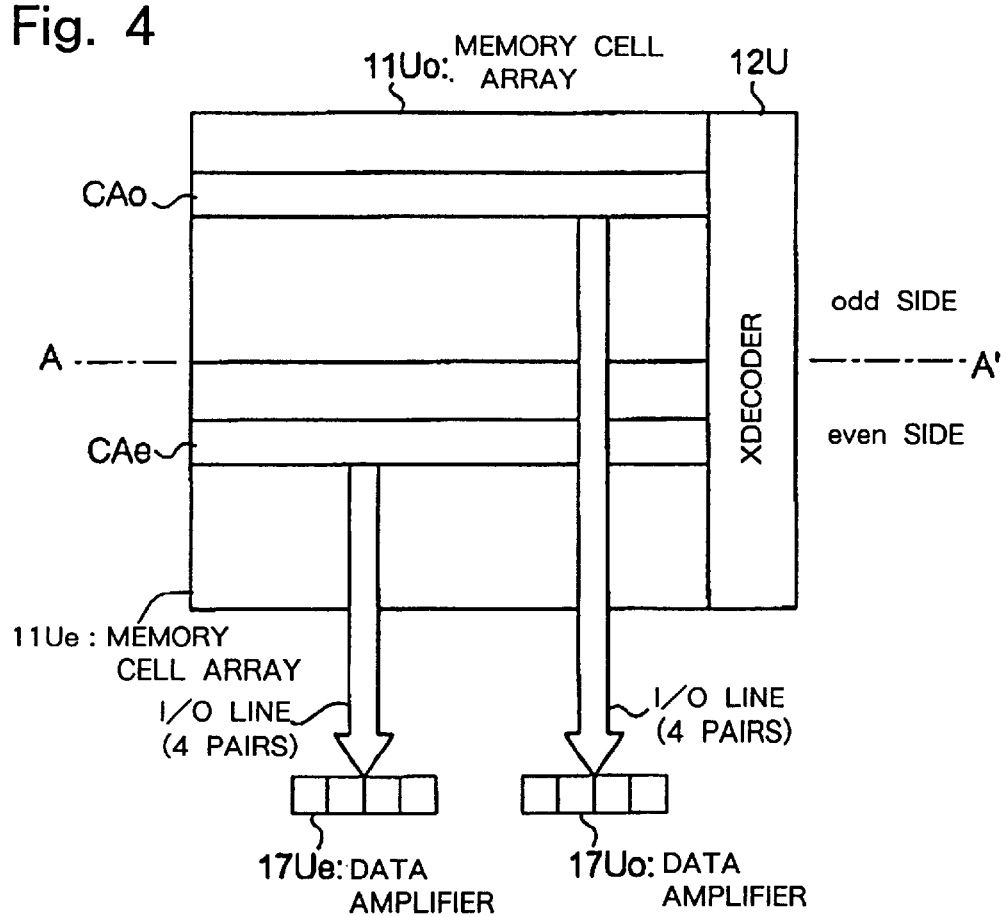
FIG. 4 is an explanatory view showing the separate reading of each of even data and odd data from two memory cell arrays into which a single memory sub-array has been subdivided in a semiconductor memory device according to an embodiment of the present invention.

In the semiconductor memory device according to this aspect, the I/O lines used for accessing even data are shorter than the I/O lines used for accessing odd data. FIG. 4 illustrates this point and shows only data amplifiers 17Ue and 17Uo that correspond to upper memory cell arrays 11Ue and 11Uo and the memory sub-array that is made up by upper memory cell arrays 11Ue and 11Uo shown in FIG. 2. As shown in the figure, the memory cell array that is activated by X-decoder 12U accompanying one address access is the area indicated by the sign CAe on the even side and the area indicated by the sign CAo on the odd side. In this case, four pairs of I/O lines are used on each of the even side and odd side to perform a one burst portion of input/output for one input/output pad (1DQ).

If the boundary line along which memory cell array 11Ue is contiguous with memory cell array 11Uo is then indicated by A–A' as shown in the figure, the maximum length of I/O lines for reading even data is the distance in the vertical direction from the position at which data amplifier 17Ue is arranged to boundary line A–A'. In the above-described example of numerical values, the maximum length is approximately 1 mm. The maximum length of the I/O lines for reading odd data, on the other hand, is the distance from the position at which data amplifier 17Uo is located to the upper end of memory cell array 11Uo. This distance is the same as for the semiconductor memory device of the prior art, and in the above-described example of numerical values is approximately 2 mm. In other words, the length of the even I/O lines is one half that of the odd I/O lines. The example of the configuration shown in FIG. 4 is for the configuration for simultaneously reading even data and odd data from the same memory sub-array, but with regard to the maximum length of the I/O lines, the configuration for simultaneously reading even data and odd data that straddle two memory sub-arrays is just the same.

Figure 5:
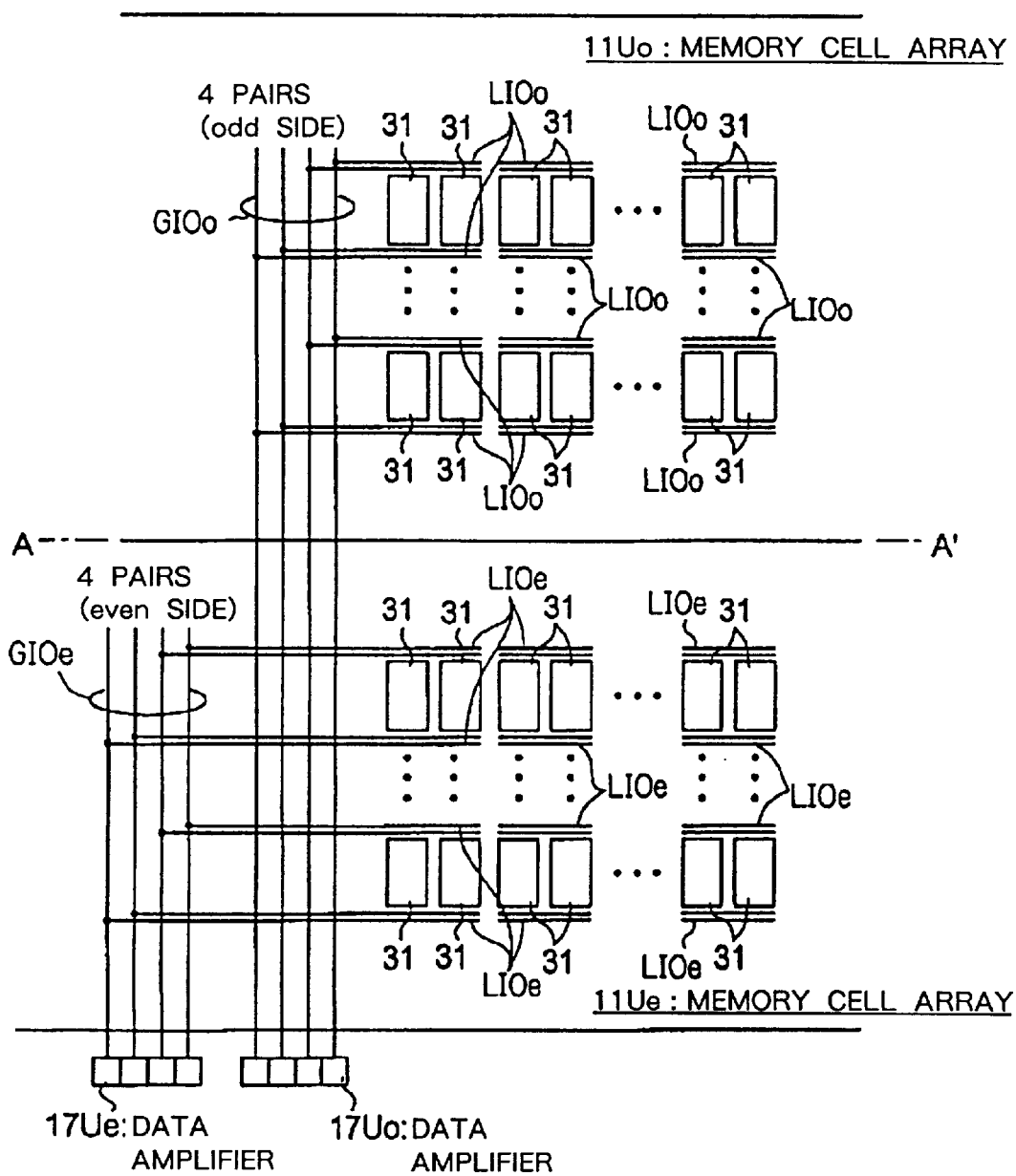
FIG. 5 is an explanatory view showing the relation between the I/O lines and memory cell plates in the semiconductor memory device according to the present embodiment.

Next, FIG. 5 shows the arrangement of I/O lines in somewhat more detail than FIG. 2 and FIG. 4, and shows, of the configuration of memory cell arrays 11U$e$ and 11U$o$, only the vicinity in which data amplifiers 17U$e$ and 17U$o$ are arranged. In the figure, reference numerals 31, 31, 31 are memory cell plates, into which each of memory cell arrays 11U$e$ and 11U$o$ are further equally subdivided, and only a portion of the memory cell plates is shown in the figure. In this case, the increased length of the I/O lines that accompanies the increase to large capacity of the semiconductor memory device gives rise to the problem of an increase in wiring delay brought about by the increase in capacitance of the I/O lines. In this embodiment, a hierarchical I/O line structure is adopted to limit this increase in wiring delay, the I/O lines being composed of local I/O lines and global I/O lines that connect to a plurality of local I/O lines.

Global I/O lines GIO$e$ and GIO$o$ shown in the figure are I/O lines for transferring even data and odd data, respectively, global I/O lines GIO$e$ being connected to data amplifier 17U$e$ and global I/O lines GIO$o$ being connected to data amplifier 17U$o$. As can be understood from the foregoing explanation, it can be seen that the length of global I/O lines GIO$e$ is about half that of global I/O lines GIO$o$. In addition, global I/O lines GIO$e$ and GIO$o$ are both composed of four pairs of parallel I/O lines, the four pairs of I/O lines that make up global I/O lines GIO$e$ each being connected to a respective one of the data amplifiers that make up data amplifier 17U$e$.

Local I/O lines LIO$e$ and LIO$o$, on the other hand, are I/O lines for connecting the memory cells in each memory cell plate to the global I/O lines by way of sense amplifiers and column switches that are not shown in the figure. In the example shown in the figure, two memory cell plates 31 and 31 that are adjacent to each other horizontally share local I/O lines, and the local I/O lines therefore run between these two memory cell plates. Local I/O lines LIO$e$ and LIO$o$ are both composed of four pairs of local I/O lines corresponding to the number of bits of even data and odd data. In addition, each of the local I/O lines that make up, for example, local I/O lines LIO$e$ is connected to a respective global I/O line that makes up global I/O lines GIO$e$. Two memory cell plates as described above and local I/O lines make up a structure, and each of memory cell arrays 11U$o$ and 11U$e$ are then constituted by arranging a plurality of these structures in the vertical and horizontal directions of the figure.

Figure 6:
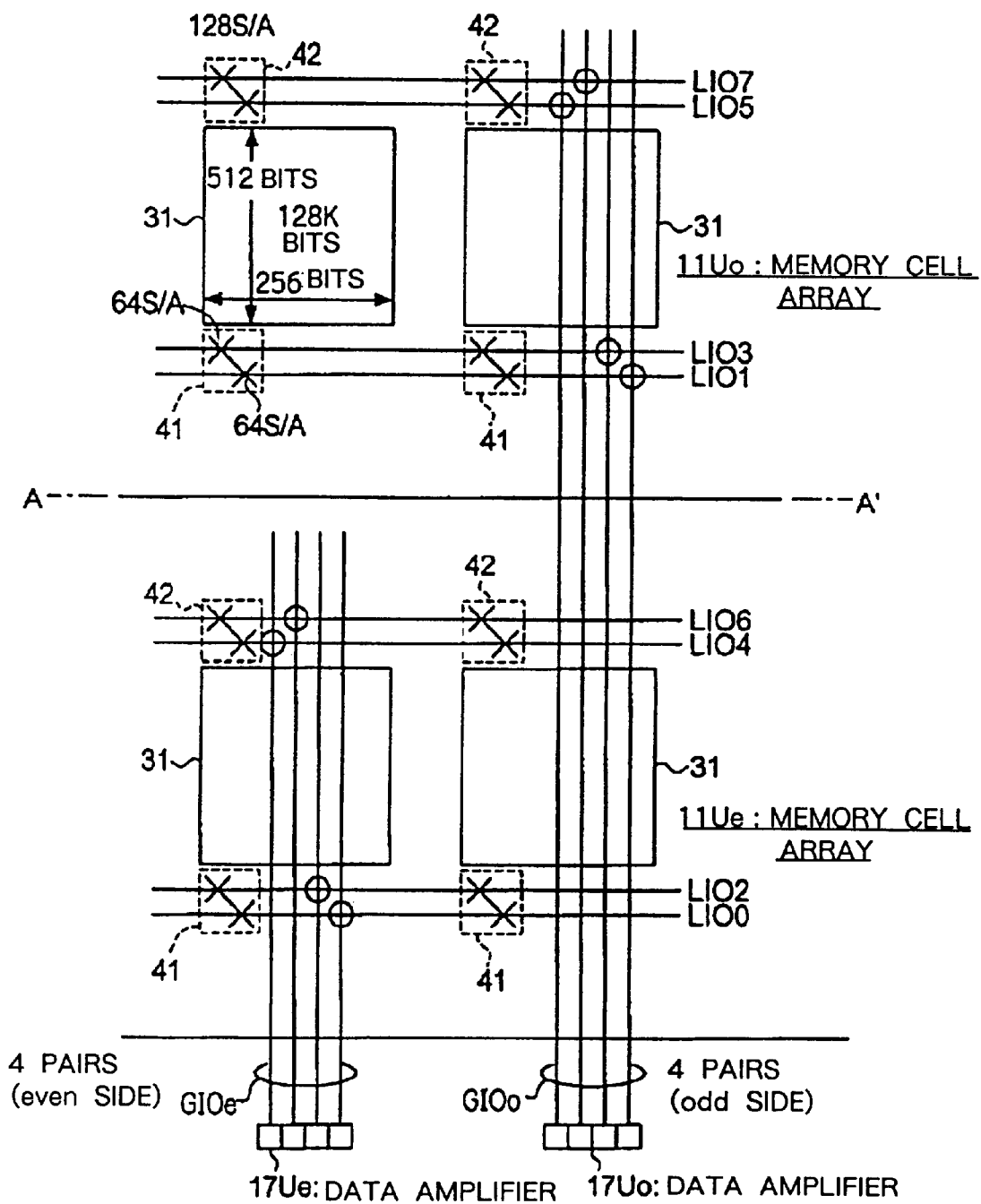
FIG. 6 is a first explanatory view showing the mode of wiring of the I/O lines in the semiconductor memory device according to the present embodiment.

FIG. 6 shows, in still greater detail, the configuration that is shown in FIG. 5, and shows, extracted from each of memory cell arrays 11U$e$ and 11U$o$, just two memory cell plates that share local I/O lines. Each memory cell plate 31 has a capacity of, for example, 512 bits (rows)×256 bits (columns)=128 k bits. Sense amplifier groups 41 and 42 are subdivided and arranged in the proximity of the lower edge and upper edge, respectively, of each memory cell plate 31. These sense amplifier groups are divided and arranged above and below memory cell plate 31 because the sense amplifiers cannot be arranged in a line at the pitch of the digit lines (omitted in the figure) that are connected to the memory cells in memory cell plate 31.

Since 256 sense amplifiers, corresponding to the number of bits in the column direction of memory cell plate 31, are required to sense the memory cells in memory cell plate 31, 128 sense amplifiers ("128 S/A" in the figure) are provided in each of sense amplifier groups 41 and 42. Further, two sets of 64 sense amplifiers ("64 S/A" in the figure) indicated by "×" are present in each of sense amplifier groups 41 and 42, and each of the sets are connected to individual local I/O lines by way of column switches that are omitted in the figure. Finally, sense amplifier groups 41 and 42 are drawn on the left sides of memory cell plates 31 for the sake of easy depiction, but in actuality, each of the sense amplifiers is arranged at equal intervals along the upper and lower edges of memory cell plates 31.

Next, reference signs LIO0–LIO7 all indicate local I/O lines, these being I/O lines for transferring the data of bits 0–7 used in one burst operation. Since each local I/O line is shared by two memory cell plates as described hereinabove, each local I/O line is connected to two sets of 64 sense amplifiers. In other words, 64×2 sense amplifiers share a single local I/O line. Local I/O lines need not be shared by two memory cell plates, and may be shared between three or more memory cell plates.

Local I/O lines LIO1 and LIO2 run in a horizontal direction along the lower side of the memory cell plates 31 in memory cell array 11U$e$, and local I/O lines LIO4 and LIO6 similarly run horizontally along the upper side of memory cell plates 31 in memory cell array 11U$e$. Local I/O line LIO0 corresponding to bit 0, for which the highest-speed access is required, is arranged at the closest location to data amplifier 17U$e$. Besides these lines, local I/O lines LIO1 and LIO3 run along the lower side of memory cell plates 31 in memory cell array 11U$o$, and local I/O lines LIO5 and LIO7 run along the upper side of the same memory cell plates 31.

Local I/O lines LIO0, LIO2, LIO4, and LIO6 intersect with the four pairs of I/O lines that make up global I/O lines GIO$e$ at memory cell plate 31 located on the left in memory cell array 11U$e$. Similarly, local I/O lines LIO1, LIO3, LIO5, and LIO7 intersect with the four pairs of I/O lines that make up global I/O lines GIO$o$ at memory cell plate 31 located on the right side in memory cell array 11U$o$. Thus, in the example of a layout configuration shown in FIG. 6, four pairs of global I/O lines lead out on the even side and odd side for every two memory cell plates that share local I/O lines in each of memory cell arrays 11U$e$ and 11U$o$. Furthermore, global I/O lines are arranged on the side of the memory cell plate located on the left side of the figure for the even data, while for the odd data, the global I/O lines are arranged on the side of the memory cell plate that is located on the opposite right side of the figure.

Figure 7:
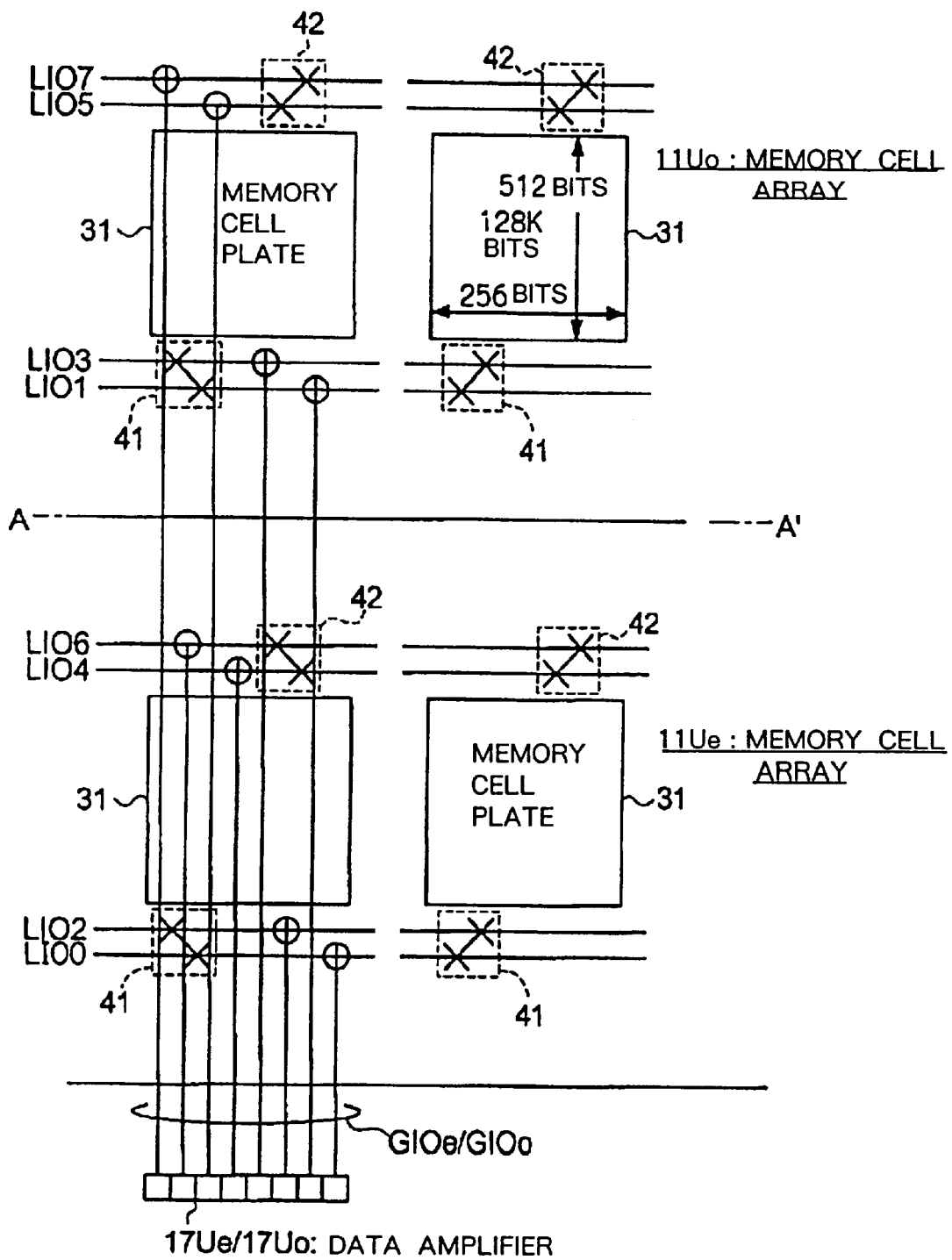
FIG. 7 is a second explanatory view showing the mode of wiring of the I/O lines in the semiconductor memory device according to the present embodiment.

Similar to FIG. 6, FIG. 7 shows in greater detail the configuration shown in FIG. 5, and is an example of a layout configuration of the wiring of global I/O lines for a different aspect than is shown in FIG. 6. This layout is not for a configuration in which two adjacent memory cell plates share local I/O lines. In contrast to the layout shown in FIG. 6 in which 1DQ corresponds to four memory cell plates 31, in the example layout shown in FIG. 7, 1DQ corresponds to two memory cell plates 31. As a result, a specific memory cell plate 31 in memory cell array 11U$o$ forms a set with a specific memory cell plate 31 in memory cell array 11U$e$ that is located at the same position horizontally, with global I/O lines arranged for the two memory cell plates.

In the example layout of FIG. 7, four pairs of global I/O lines (corresponding to global I/O lines GIO$e$ in FIG. 5) lead in the vertical direction of the figure from local I/O lines LIO0, LIO2, LIO4, and LIO6 that are arranged in memory cell array 11U$e$ to data amplifier 17U$e$/17U$o$. Similarly, global I/O lines (corresponding to global I/O lines GIO$o$ in FIG. 5) lead in the vertical direction in the figure from local I/O lines LIO1, LIO3, LIO5, and LIO7 that arranged in memory cell array 11Uo to data amplifier 17Ue/17Uo.

A number of other layouts can be considered in addition to the layouts shown in FIG. 6 and FIG. 7, but the two types of layout configurations here described are shown as examples.

Explanation of Operation

The overall operation of the semiconductor memory device according to the above-described configuration is next described.

(1) Read Operation (a) When Reading Even Data and Odd Data from the Same Memory Sub-arrays The leading read address of a memory cell that is to be the object of a burst read is supplied to an address terminal (not shown in the figure) from outside the semiconductor memory device. It is assumed here that the read address designates a memory cell group in the upper memory sub-array. Further, this explanation is for a semiconductor memory device that is operating in the through mode. Upon receiving the read address, X-decoder 12U activates the word lines that are designated by the row addresses contained in the read address for each of memory cell arrays 11Ue and 11Uo (refer to FIG. 4). Accompanying this activation, the sense amplifiers sense the data of the memory cells that are connected to the activated word lines, and Y-decoders effect ON/OFF control of column switches in accordance with column addresses contained in the read address to carry out column selection.

This series of operations causes the selection of the output of eight sense amplifiers corresponding to the read addresses, and the even data and odd data are supplied to data amplifiers 17Ue and 17Uo, respectively. At this time, reading from the memory cells begins simultaneously for memory cell arrays 11Ue and 11Uo, but even data are supplied to data amplifier 17Ue first and odd data are supplied to data amplifier 17Uo afterwards due to the difference between the lengths of I/O lines on the even and odd sides. As described in detail with reference to FIG. 5–FIG. 7, the data of the memory cells are transmitted to the data amplifiers by passing the data successively from the sense amplifiers to the column switches, local I/O lines, and global I/O lines.

If described using the case of FIG. 6, for example, from memory cell plate 31 located on the left side in memory cell array 11Ue, the data of bits 0 and 2 are read through sense amplifier group 41 and column switches (not shown in the figures) and onto local I/O lines LIO0 and LIO2, and the data of bits 4 and 6 are read through sense amplifier group 42 and column switches (not shown in the figure) and onto local I/O lines LIO4 and LIO6. The even data that have been read onto these four local I/O lines are then supplied through global I/O lines GIOe to data amplifier 17Ue.

From memory cell plate 31 located on the right side in memory cell array 11Uo, on the other hand, the data of bits 1 and 3 are read through sense amplifier group 41 and column switches (not shown in the figure) and onto local I/O lines LIO1 and LIO3, and the data of bits 5 and 7 are read through sense amplifier group 42 and column switches (not shown in the figure) and onto local I/O lines LIO5 and LIO7. The odd data that have been read onto these four local I/O lines then pass through global I/O lines GIOo, pass over the area of memory cell array 11Ue, and are supplied to data amplifier 17Uo. The above-described data read operation also applies similarly in the case of the layout of FIG. 7.

When even data and odd data are supplied as described in the foregoing explanation, data amplifiers 17Ue and 17Uo amplify the level of the supplied data and output the result to parallel-serial conversion circuit 18Ue and 18Uo, respectively. Of the supplied even data, parallel-serial conversion circuit 18Ue both outputs bit 0 of data, which is to be read first, without change "through" to selector 19e, and takes in the four bits of even data. Since selection signals U/Le are "H" level at this time, selector 19e selects, of parallel-serial conversion circuits 18Ue and 18Le, the output of the former and supplies the data of bit 0 to one of the input terminals of multiplexer 20. In accordance with the timing outside the semiconductor memory device, multiplexer 20 outputs, at the time the basic clock CLK rises, the data of bit 0 that was supplied from selector 19e to the outside of semiconductor memory device through input/output pad 10.

In parallel with this operation, parallel-serial conversion circuit 18Uo both takes in the odd data that have been amplified by data amplifier 17Uo and then outputs the data of bit 1 to selector 19o at the time of falls of basic clock CLK. Since selection signals U/Lo are at "H" level at this time, selector 19o selects, of parallel-serial conversion circuits 18Uo and 18Lo, the output of the former and supplies the data of bit 1 to the other input terminal of multiplexer 20.

Multiplexer 20 outputs the data of bit 1 that have been supplied from selector 19o out of the semiconductor memory device through input/output pad 10 at the time the basic clock CLK again falls. Thus, the time at which multiplexer 20 selects and outputs the data of bit 1 to input/output pad 10 follows the time at which the data of bit 0 was outputted to input/output pad 10 by a time interval that is, even at the minimum estimate, equivalent to a half-period of the basic clock CLK. In other words, it is only necessary that the data of bit 1 arrive at multiplexer 20 by this time, and the arrival of odd data at data amplifier after the arrival of even data as described in the foregoing explanation presents no problem.

Each of the bits from bit 2 to bit 7 are subsequently outputted in that order to the outside of the semiconductor memory device in synchronization with the rise and fall of basic clocks CLK. At this time, parallel-serial conversion circuit 18Ue sequentially supplies the data of bits 2, 4, and 6 to selector 19e in synchronization with the falls of basic clock CLK while shifting the content it holds one bit at a time in the direction from left to right in the figure. In the same way as parallel-serial conversion circuit 18Ue, parallel-serial conversion circuit 18Uo sequentially supplies the data of bits 3, 5, and 7 to selector 19o in synchronization with the rises of basic clock CLK while carrying out a shift operation one bit at a time. Multiplexer 20 on the other hand, alternately selects the outputs of selectors 19e and 19o at the rises and falls of basic clock CLK and outputs to the outside of the semiconductor memory device from input/output pad 10.

The operations when reading from the lower memory sub-arrays follow the same procedures as the read operation from the upper side described above, the points of difference with the read operation from the upper memory sub-array being that: even data and odd data are supplied from memory cell arrays 11Le and 11Lo to parallel-serial conversion circuits 18Le and 18Lo through data amplifiers 17Le and 17Lo; and, since selection signals U/Le and U/Lo are both "L" level, selectors 19e and 19o select the output side of parallel-serial conversion circuits 18Le and 18Lo and supply the outputs of these circuits to multiplexer 20.

(b) When Reading Even Data and Odd Data from Different Memory Sub-arrays

In this explanation, it is assumed that even data and odd data are simultaneously read from memory cell arrays 11Ue and 11L*o*, respectively. In this case as well, operations take as a basis the operations performed when reading from the same memory sub-array. In other words, upon supply of a leading read address from outside the semiconductor memory device, X-decoder 12U activates word lines in memory cell array 11U*e*, and in parallel with this operation, X-decoder 12L activates the word lines inside memory cell array 11L*o*. Sensing by sense amplifiers and column selecting by column switches are carried out, and even data and odd data are read from memory cell arrays 11U*e* and 11L*o* as when reading from the same memory sub-array.

Data amplifiers 17U*e* and 17L*o* amplify the levels of the even data and odd data, respectively, that are read from memory cell arrays 11U*e* and 11L*o* and then supply the results to parallel-serial conversion circuits 18U*e* and 18L*o*, respectively. Parallel-serial conversion circuits 18U*e* and 18L*o* take in the four bits of supplied parallel data and serially output the data to selectors 19*e* and 19*o*, respectively, as described hereinabove, with the exception of bit 0, which parallel-serial conversion circuit 18U*e* outputs "through" to selector 19*e*. Although selection signals U/Le are at "H" level at this time as described above, selection signals U/Lo are at "L" level.

Selector 19*e* therefore selects and supplies the even data that have been outputted from parallel-serial conversion circuit 18U*e* to multiplexer 20, while selector 19*o* selects and supplies the odd data that have been outputted from parallel-serial conversion circuit 18L*o* to multiplexer 20. Multiplexer 20 selects the data of bit 0–bit 7 that are sequentially supplied from selectors 19*e* and 19*o* in synchronization with the rises and falls of basic clock CLK and in that order and outputs to the outside of semiconductor memory device from input/output pad 10.

The process of simultaneously reading odd data and even data from memory cell arrays 11U*o* and 11L*e*, respectively, is exactly the opposite of the process just described. In other words, upon being supplied with a read address, X-decoders 12U and 12L activate the word lines in memory cell arrays 11U*o* and 11L*e*, respectively. As a result, the even data and odd data are read from these memory cell arrays by way of the sense amplifiers, column switches, and I/O lines. Data amplifiers 17U*o* and 17L*e* amplify the level of the data that have been read out and supply the result to parallel-serial conversion circuits 18U*o* and 18L*e,* respectively.

Parallel-serial conversion circuits 18U*o* and 18L*e* take in the supplied parallel data and serially output to selectors 19*o* and 19*e,* respectively, with the exception of bit 0, which parallel-serial conversion circuit 18L*e* outputs "through". At this time, selectors 19*e* and 19*o* select and supply the output of parallel-serial conversion circuits 18L*e* and 18U*o*, respectively, to multiplexer 20 in accordance with selection signals U/Le and U/Lo, respectively, and multiplexer 20 outputs the serial data in order from bit 0 to bit 7 to the outside of the semiconductor memory device through input/output pad 10.

(2) Write Operation (a) When Writing Even Data and Odd Data to the Same Memory Sub-array When writing, the leading addresses of the memory cells that are to be the object of burst writing are first supplied to the address terminal from outside the semiconductor memory device, and the eight bits of data to be written are serially supplied to input/output pad 10 in synchronization with the rises and falls of the basic clock CLK. In this explanation, it is assumed that the write addresses designate the upper memory sub-array.

Since the write data of bit 0 is supplied to input/output pad 10 first, demultiplexer 13 outputs the write data of bit 0 to demultiplexer 14*e* in synchronization with the fall of basic clock CLK. Since selection signals U/Le are at "H" level at this time, demultiplexer 14*e* supplies the write data of bit 0 to serial-parallel conversion circuit 15U*e*. Serial-parallel conversion circuit 15U*e* both takes in the supplied write data of bit 0 at the fall of basic clock CLK and shifts its own held content one bit from the right to the left in the figure.

The write data of bit 1 are then supplied to input/output pad 10 immediately following bit 0, and demultiplexer 13 therefore outputs the write data of bit 1 to demultiplexer 14*o*. Since selection signals U/Lo are at "H" level at this time, demultiplexer 14*o* supplies the write data of bit 1 to serial-parallel conversion circuit 15U*o*. Serial-parallel conversion circuit 15U*o* takes in the write data of bit 1 at the rise of basic clock CLK and performs a one-bit shift as with bit 0.

The write data of bit 2–bit 7 are subsequently supplied in succession, and the same operations as have been described relating to bits 0 and 1 are repeated three times. Serial-parallel conversion circuits 15U*e* and 15U*o* thus output each of the even data and odd data within the write data that have been received in a burst. Write amplifiers 16U*e* and 16U*o* then simultaneously write the four bits each of parallel even data and odd data to memory cell arrays 11U*e* and 11U*o*.

Writing to the lower memory sub-array is the same as writing to the upper side as described hereinabove, the point of difference with writing to the upper memory sub-array being that the levels of selection signals U/Le and U/Lo are exactly opposite the levels described above, and demultiplexers 14*e* and 14*o* therefore supply the write data to serial-parallel conversion circuits 15L*e* and 15L*o*, respectively. As a result, writing is carried out with respect to memory cell arrays 11L*e* and 11L*o* by way of serial-parallel conversion circuits 15L*e* and 15L*o* and write amplifiers 16L*e* and 16L*o*.

(b) When Writing Even Data and Odd Data to Different Memory Sub-arrays

In this case, even data and odd data are simultaneously written to memory cell arrays 11U*e* and 11L*o*, respectively. Operations in this case follow the same procedures as in a case of writing to the same memory sub-array. Specifically, operations are exactly the same as described hereinabove up to the point of supplying the write data to demultiplexers 14*e* and 14*o*. From this point, demultiplexer 14*e* sequentially supplies the serially supplied even data to serial-parallel conversion circuit 15U*e,* and after serial-parallel conversion circuit 15U*e* converts the even data to parallel data, the four bits are simultaneously written to memory cell array 11U*e* by way of write amplifier 16U*e*. On the other hand, demultiplexer 14*o* sequentially supplies the supplied odd data to serial-parallel conversion circuit 15L*o,* and following conversion of the odd data to parallel data at serial-parallel conversion circuit 15L*o*, the data are simultaneously written to memory cell array 11L*o* by way of write amplifier 16L*o*.

In the case of simultaneously writing odd data and even data to memory cell arrays 11U*o* and 11L*e*, respectively, the operations are the reverse of those in the foregoing description. Specifically, demultiplexer 14*e* sequentially supplies the even data that were supplied from demultiplexer 13 to serial-parallel conversion circuit 15L*e*, and these data are converted to parallel data, and four bits are simultaneously written to memory cell array 11L*e* by way of write amplifier 16L*e*. On the other hand, demultiplexer 14*o* sequentially supplies the odd data that were supplied from demultiplexer 13 to serial-parallel conversion circuit 15U*o*, and these data are converted to parallel data, and four-bit simultaneous writing is carried out to memory cell array 11U*o* by way of write amplifier 16U*o*.

Examples of Actual Configuration of Each Constituent Element

Examples of the actual configuration of a number of the constituent elements shown in FIG. 2 are next explained.

(1) Serial-Parallel Conversion Circuit

Figure 8:
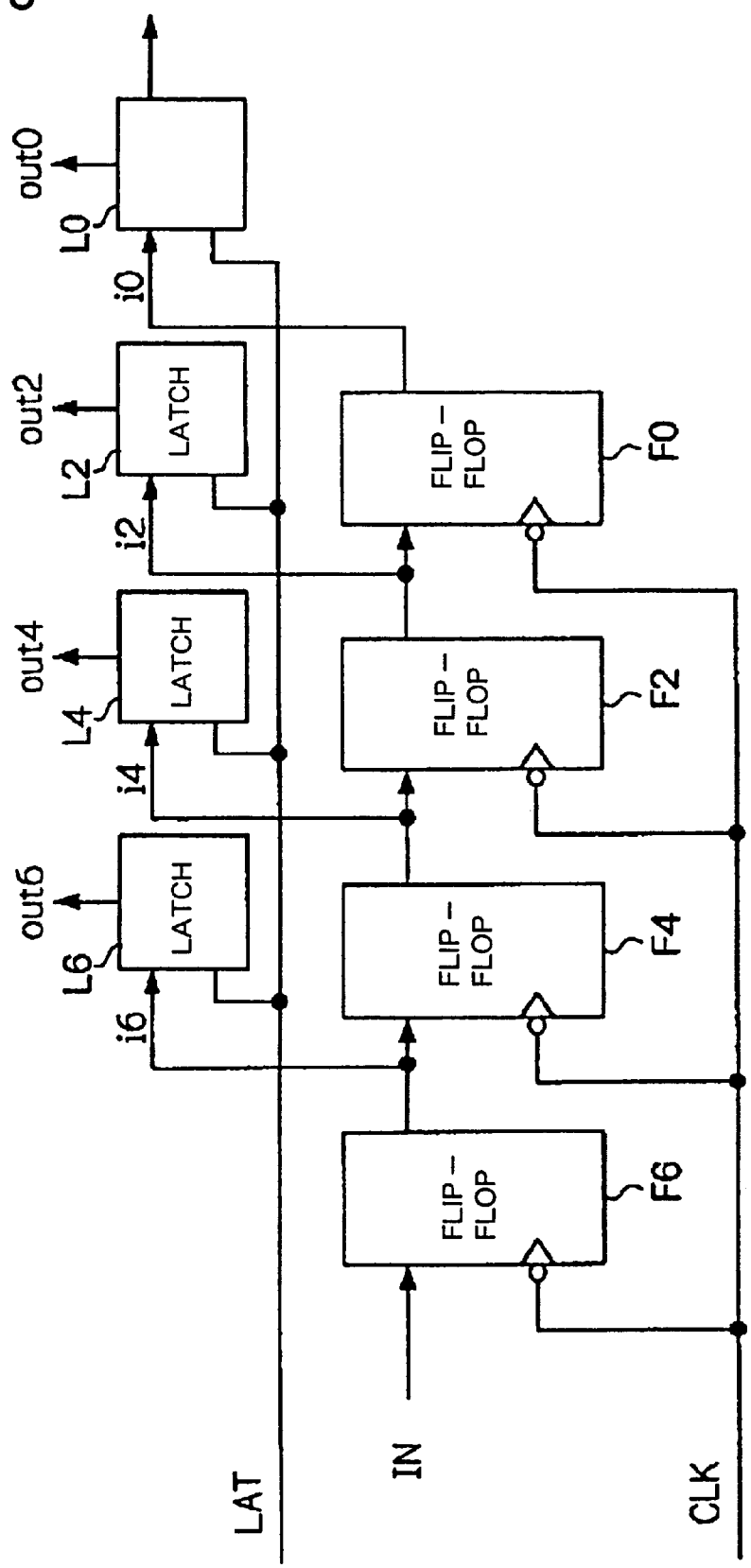
FIG. 8 is a circuit diagram showing details of the configuration of the serial-parallel conversion circuit in the semiconductor memory device according to the present embodiment.

FIG. 8 shows the actual configuration of serial-parallel conversion circuits 15U$e$ and 15L$e$. This figure shows an example of the configuration for a case in which the unit of a single burst of writing is 8 bits. Of these circuits, the following explanation is based on serial-parallel conversion circuit 15U$e$, and the points of difference between the even serial-parallel conversion circuit and odd serial-parallel conversion circuits 15U$o$ and 15L$o$ will be explained afterward.

Since serial-parallel conversion circuit 15U$e$ converts to parallel data only the even data of the eight bits of serial data that are to be written to memory cells, serial-parallel conversion circuit 15U$e$ is made up of four stages of flip-flops F6, F4, F2, and F0 and four latches L6, L4, L2, and L0, as shown in the figure. All of these flip-flops are negative-edge trigger D-flip-flops. Basic clocks CLK are received at a clock input terminal, and input data IN are taken in and then sent to the next stage at the falling edge of these clocks.

Although not shown in FIG. 8, the data input terminal of flip-flop F6 is connected to the output terminal of demultiplexer 14$e$ shown in FIG. 2, and this data input terminal receives the supply of even data as input data IN. The data input terminals of flip-flops F4, F2, and F0 are connected to the data output terminal of the preceding-stage flip-flops F6, F4, and F2, respectively. The output from the preceding flip-flop that corresponds to each flip-flop is supplied to the input terminals of latches L6, L4, L2, and L0, respectively, as input data i6, i4, i2, and i0, respectively.

Latches L6, L4, L2, and L0 latch the input data i6, i4, i2, and i0 that are supplied to the respective input terminals when latch signal LAT rises to "H" level, and output the latched data as output data Out6, Out4, Out2, and Out0. The output terminals of these four latches are each connected to the input terminal of individual write amplifiers that make up write amplifier 16U$e$ shown in FIG. 2. In addition, latch signals LAT are signals generated by the above-described control circuit and are not shown in FIG. 2 to avoid complicating the figure.

Figure 9:
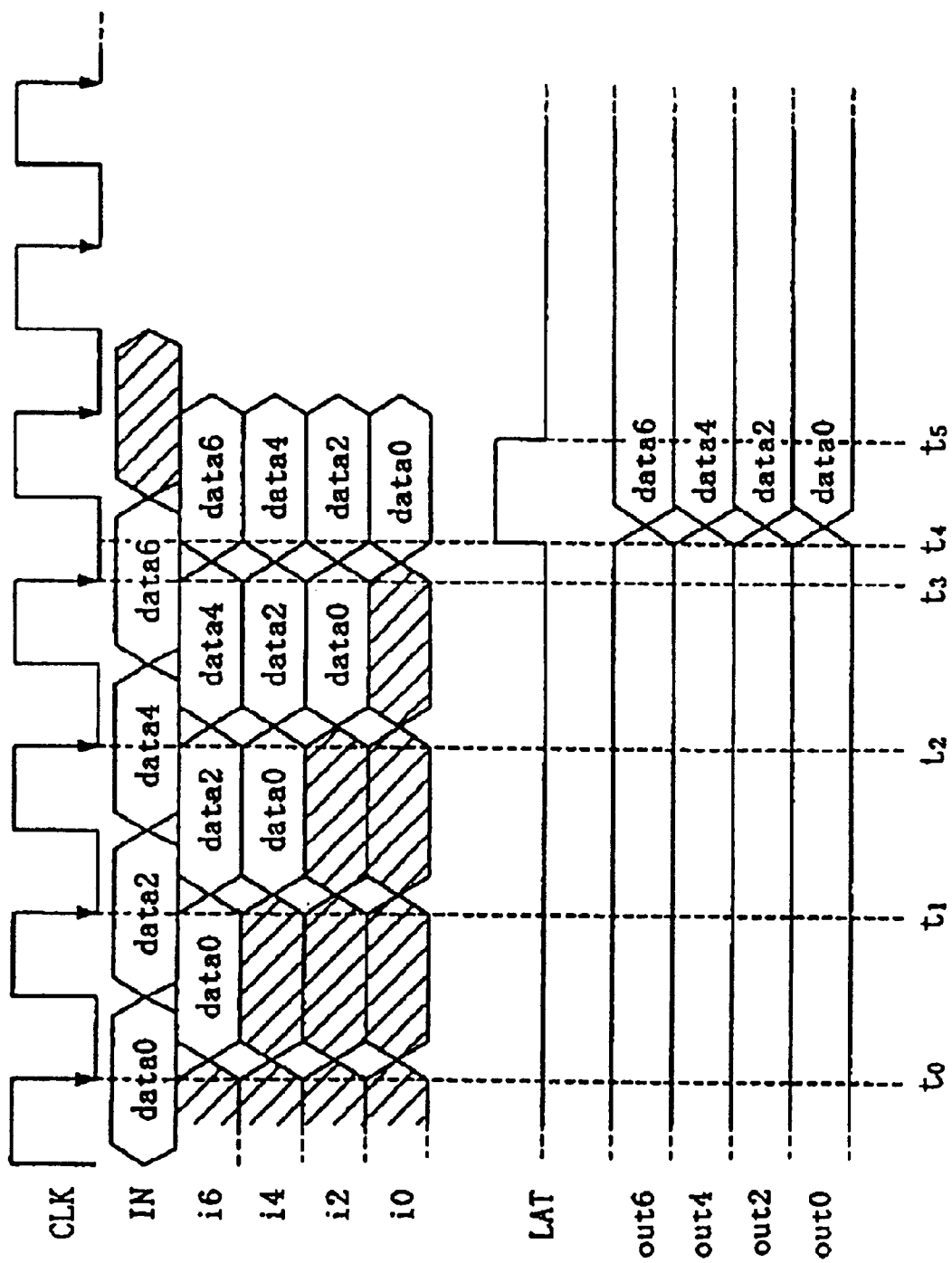
FIG. 9 is a timing chart showing the operation of the serial-parallel conversion circuit in the semiconductor memory device according to the present embodiment.

As shown in the timing chart of FIG. 9, the four-bit serial even data supplied from demultiplexer 14$e$ are converted to parallel data by means of the above-described configuration. First, "data0," which is the first bit of data, is supplied as input data IN, and flip-flop F6 takes in "data0" when basic clock CLK falls at time t0 during the time interval of the supply of these data. As a result, the input data i6 to flip-flop F4 and latch L6 becomes "data0." The second bit of data "data2" is then supplied as input data IN, and input data i6 becomes "data2" in the same way as described above when basic clock CLK falls at time t1 during the time of this supply. "Data0," which was the immediately preceding input data i6, is taken into flip-flop F4, and these data become the input data i4 to flip-flop F2 and latch L4.

In the same way, new input data IN are subsequently supplied and the data are shifted one bit each time basic clock CLK falls. In other words, at time t2, not only do input data i6 become "data4," but the immediately preceding input data i6 and i4 become the output of flip-flops F4 and F2, respectively, and the input data i4 and i2 become "data2", and "data0. At time t3, not only do input data i6 become "data6," but the immediately preceding input data i6, i4, and i2 are outputted to flip-flops F4, F2,and F0, whereby input data i4, i2, and i0 become "data4," "data2," and "data0," respectively. Then, following the completion of the data shift operation at time t3, latch signal LAT rises at time t4.

Upon rise of latch signal LAT, input data i6, i4, i2, and i0 at this time ("data6," "data4," "data2," and "data0") are latched at latches L6, L4, L2, and L0, respectively, and all outputted as output data Out6, Out4, Out2, and Out0, respectively. The four bits of even data "data0," "data2," "data4," and "data6" that were serially supplied are thus converted to parallel data and outputted to write amplifier 16U$e$. Although latch signal LAT falls at time t5, each of the outputs of latches L6, L4, L2, and L0 are held during the write operation.

In odd serial-parallel conversion circuits 15U$o$ and 15L$o$, positive-edge trigger D-flip-flops may be used in place of flip-flops F6, F4, F2, and F0, and the shift operation can be carried out in synchronization with the rises of basic clock CLK.

(2) Parallel-Serial Conversion Circuit

Figure 10:
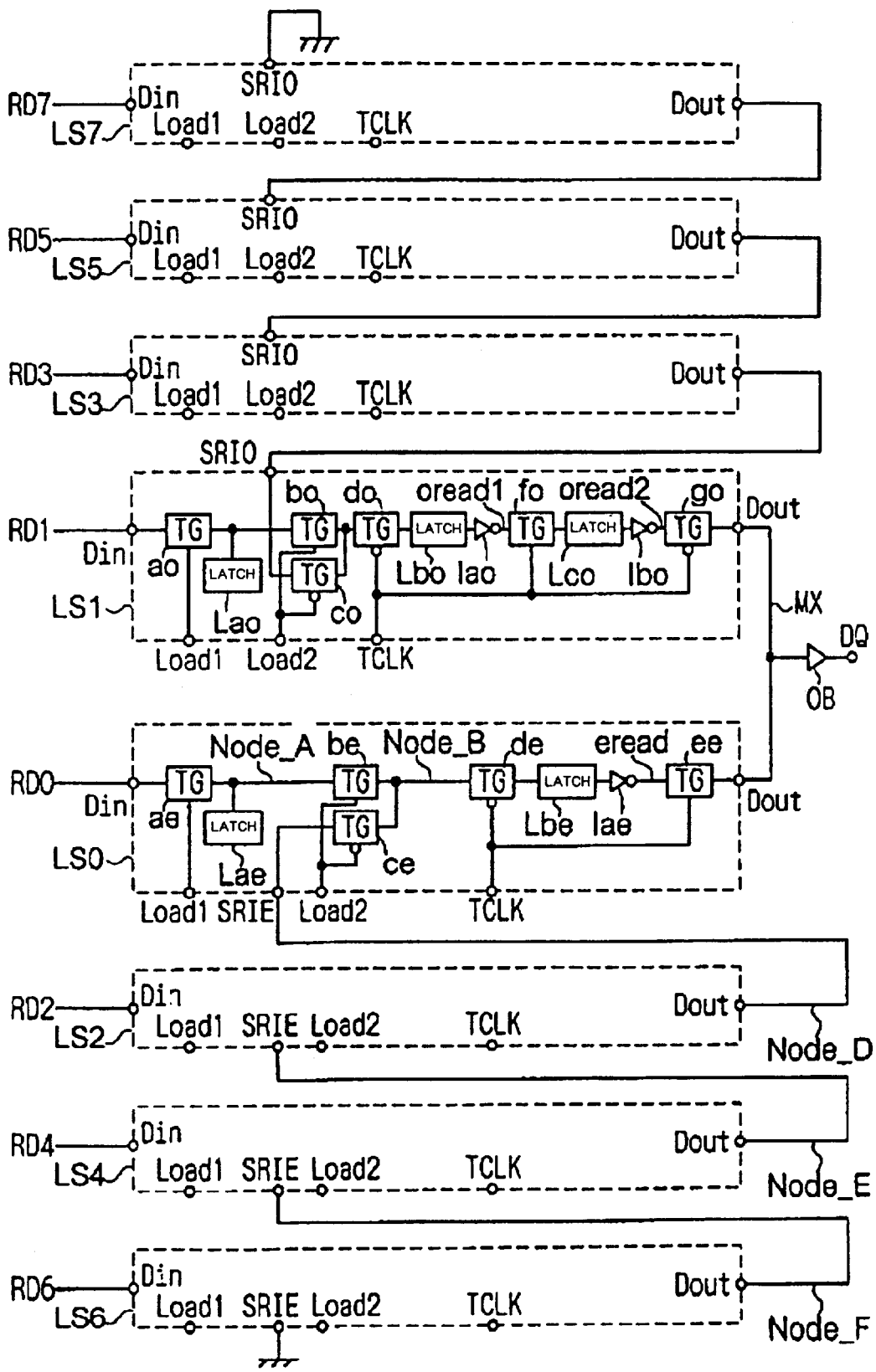
FIG. 10 is a circuit diagram showing the actual configuration of a parallel-serial conversion circuit in the semiconductor memory device according to the present embodiment.

FIG. 10 shows an example of the actual configuration of parallel-serial conversion circuits 18U$e$, 18L$e$, 18U$o$, and 18L$o$ shown in FIG. 2. FIG. 10 shows the configuration when the units of a single burst read is eight bits in accordance with the above-described serial-parallel conversion circuit. The following explanation relates to the upper parallel-serial conversion circuits 18U$e$ and 18U$o$ of the above-described parallel-serial conversion circuits, but the lower parallel-serial conversion circuits are similar. In FIG. 10, the functions of selectors 19$e$ and 19$o$ and multiplexer 20 shown in FIG. 2 are included within the parallel-serial conversion circuit. FIG. 10, moreover, shows output buffer OB that was omitted in FIG. 2, the output of the even and odd parallel-serial conversion circuits being outputted by way of this output buffer OB to the outside of the semiconductor memory device as output DQ.

In the figure, the circuit blocks LS0–LS7 together constitute a shift register with a load function, each of the individual circuit blocks corresponding to a stage of the shift register. In other words, circuit blocks LS0–LS7 correspond to bits 0–7, the eight bits of parallel data that are simultaneously read from memory cell arrays 11U$e$ and 11U$o$. Circuit blocks LS0, LS2, LS4, and LS6 constitute the even shift register, and LS1, LS3, LS5, and LS7 constitute the odd shift register. Since the configurations of the even circuit blocks are all identical and the configurations of the odd circuit blocks are all identical, only the internal configuration of circuit blocks LS0 and LS1 are shown in FIG. 10 to represent the even and odd circuit blocks.

Each of the circuit blocks is provided with: Load1 terminal to which load signal Load1 is supplied; Load2 terminal to which load signal Load2 is supplied; TCLK terminal to which is supplied a signal in which the logic of basic clock CLK and selection signals U/L$e$ or selection signals U/L$o$ shown in FIG. 2 are combined (to be explained in detail below); initial data input terminal Din to which are supplied bit data that have been read from the memory cell arrays; data output terminal Dout which is the output of each individual circuit block; and shift data input terminal SRIE (even) or SRIO (odd) to which are supplied data from the circuit block that corresponds to the preceding stage of the shift register.

Signals common to all of the circuit blocks are applied to the Load1 terminal and Load2 terminal. Regarding the TCLK terminal, a signal that is common to the even circuit blocks is applied to the even blocks and a signal that is common to the odd circuit blocks is applied to the odd blocks. For the sake of simplifying the figure, the signals that are supplied to the Load1 terminal, Load2 terminal, TCLK terminal are all omitted in FIG. 10. In this embodiment, moreover, the above-described through mode and latch mode are switched by controlling the timings and levels of load signal Load1 and load signal Load2, but the details will be described in the explanation of the operation.

To describe each of the above-described terminals in still greater detail, data RD0–RD7 that correspond to bits 0–7 of parallel data that have been simultaneously read from memory cell arrays 11U$e$ and 11U$o$ are supplied to the initial data input terminal Din of circuit blocks LS0–LS7 through data amplifiers 17U$e$ and 17U$o$. The outputs of data output terminals Dout of circuit blocks LS2–LS7 are each applied to the shift data input terminal SRIE or SRIO of the next circuit block that makes up the shift register. In other words, the outputs of circuit blocks LS6, LS4, and LS2 are applied to shift data input terminals SRIE of circuit blocks LS4, LS2 and LS0; and the outputs of circuit blocks LS7, LS5, and LS3 are applied to shift data input terminals SRIO of LS5, LS3, and LS1, respectively. Because there is no circuit block that corresponds to a preceding stage of the shift register for circuit blocks LS6 and LS7, shift data input terminals SRIE and SRIO of these circuit blocks are connected to the ground potential, and are equivalent to a configuration in which a fixed value "0" is applied.

The signal that is supplied to the TCLK terminal is next described in greater detail. As described hereinabove, in FIG. 10, the functions of selectors 19$e$ and 19$o$ and multiplexer 20 are included in the parallel-serial conversion circuits. Thus, in FIG. 10, rather than switching signal paths as shown in FIG. 2, the outputs of the even and odd parallel-serial conversion circuits (data output terminals Dout of circuit blocks LS0 and LS1) are connected in common. Further, although FIG. 10 shows the upper parallel-serial conversion circuit, the lower parallel-serial conversion circuit, which is not shown in the figure, also has outputs connected in common as in the upper parallel-serial conversion circuit, and the four outputs of the upper and lower parallel-serial conversion circuits are also connected in common.

In the case of the upper parallel-serial conversion circuit, a signal that takes the logical AND product of basic clock CLK and selection signals U/L$e$ (refer to FIG. 2) is supplied to the TCLK terminal of each of the even circuit blocks. Similarly, a signal that takes the logical AND product of basic clock CLK and selection signals U/L$o$ (refer to FIG. 2) is supplied to the TCLK terminal of the odd circuit blocks. The lower parallel-serial conversion circuit is substantially the same as the upper parallel-serial conversion circuit but uses the inverted signals of selection signals U/L$e$ and the inverted signals of selection signals U/L$o$ in place of selection signals U/L$e$ and U/L$o$, respectively. The reasons for the above-described configuration are to reduce to the utmost the number of gate sections on the critical signal paths from data RDn (n=0, 1, 7) to output DQ, and to reduce the length of the signal paths to a minimum.

This explanation is based on the upper parallel-serial conversion circuit, and selection signals U/L$e$ and U/L$o$ are both at the "H" level when the upper parallel-serial conversion circuit is in operation. This is therefore equivalent to supplying basic clock CLK to all of the TCLK terminals of each of the circuit blocks of the upper portion. The following explanation is therefore presented as if basic clock CLK were applied to the TCLK terminal of each of the circuit blocks shown in FIG. 10.

Explanation is next presented regarding each of the constituent elements that make up the circuit blocks. A number of constituent elements are common to the configurations of the even circuit blocks and the configurations of the odd circuit blocks, and although in general practice the same reference numerals are used to identify such elements, different reference numerals are here applied to constituent elements having identical composition in order to distinguish the constituent elements of the even and odd sides. In other words, in regard to these elements, reference numerals conferred to constituent elements of the even portion are given the suffix "e" and reference numerals conferred to constituent elements of the odd portion are given the suffix "o". Accordingly, elements for which only the suffix "e" or "o" of the reference numerals differ are actually identical elements. Otherwise, elements identified by different reference numerals are in fact different constituent elements.

First, the sign "TG" in the figure indicates a TG circuit having a typical transfer gate (hereinbelow abbreviated as "TG"), and as shown in subsequent FIG. 11, some of these elements are constituted only by a transfer gate while some elements are constituted by a transfer gate and inverter. Of these, in TG circuits ae, ao, be, bo, ee, and fo, a conductive state is established between the input and output terminals if control signals that are applied to the control terminal are at the "H" level, and a nonconductive state is established between the input and output terminals if these same control signals are at "L" level. When load signal Load1 for TG circuit ae is at the "H" level, for example, data RD0 that are supplied to initial data input terminal Din are supplied to latch Lae and TG circuit be. In contrast, the control terminals for TG circuits ce, co, de, do, and go have inverted input and these circuits perform operation that is opposite to that now described. For example, when load signal Load2 of TG circuit ce is at the "L" level, the data supplied to shift data input terminal SRIE are supplied to the input terminal of TG circuit de.

Next, latch Lae becomes necessary when in latch mode, and the data that are applied to initial data input terminal Din when load signal Load1 is at the "H" level are latched through TG circuit ae. In addition, latch Lae continuously supplies latched data to TG circuit be when load signal Load1 becomes the "L" level and data are no longer supplied from TG circuit ae. Next, TG circuit be, together with TG circuit ce, constitute one type of selector. In other words, since the data to each stage of the shift register are initialized when Load2 signal is at "H" level, TG circuit be supplies data latched by latch Lae to latch Lbe by way of TG circuit de. When Load2 signal is at "L" level, on the other hand, one-bit shifting is carried out in the shift register, and TG circuit ce supplies the data received from the preceding circuit block to latch Lbe through TG circuit de. In the case of circuit blocks LS6 and LS7, shift data input terminal SRIE or SRIO is grounded, and the "L" level that corresponds to this ground potential is therefore always supplied to the input terminal of TG circuit ce.

Next, when basic clock CLK is at "L" level, TG circuit de transfers the output of TG circuit be or TG circuit ce to the input terminal of latch Lbe. This latch Lbe is for holding the data received from TG circuit de even when basic clock CLK becomes "H" level. Latch Lbe is configured so as to supply to inverter Iae an inverted form of the data that it has received. Inverter Iae further inverts the data that have been inverted by latch Lbe and then supplies the result to TG circuit ee. TG circuit ee is for outputting even data out of the semiconductor memory device in accordance with the rises of basic clock CLK, and, from a rise of the basic clock CLK until the immediately following fall, transfers the output of inverter Iae to output buffer OB.

Next, in the odd circuit blocks, each of the constituent elements from TG circuit ao to inverter Iao performs the same roles as the constituent elements from TG circuit ae to inverter Iae in the even circuit blocks. In contrast, TG circuit fo transfers the data of latch Lbo that are supplied through inverter Iao to latch Lco from a rise of basic clock CLK until the next fall. Latch Lco has the same configuration as latch Lbo, and latches the data supplied from TG circuit fo and outputs this inverted data to inverter Ibo. Inverter Ibo inverts the data supplied from latch Lco and supplies the result to the input terminal of TG circuit go. TG circuit go is for outputting odd data out of the semiconductor memory device in accordance with the falls of basic clock CLK, and transfers the output of inverter Ibo to output buffer OB from a fall of basic clock CLK until the immediately following rise.

As can be understood from the foregoing explanation, TG circuit ee in circuit block LS0 and TG circuit go in circuit block LS1 constitute selectors 19e, selector 19o, and multiplexer 20 shown in FIG. 2. In addition, of the constituent elements in the circuit blocks, TG circuit ee in circuit block LS0 and TG circuit go in circuit block LS1 together with output buffer OB are arranged in the vicinity of input/output pad 10 (refer to FIG. 2). Since there is no direct output from the other circuit blocks to output DQ, there is no need to arrange TG circuit ee and TG circuit go of these circuit blocks close to input/output pad 10. Otherwise, logic is inverted at latch Lbe and passes through inverter Iae in even circuit blocks, and besides passage through inverters Iao and Ibo, logic is inverted at each of latches Lbo and Lco in the odd circuit blocks. As a result, the data that are supplied to initial data input terminal Din or to shift data input terminals SRIE and SRIO are outputted from data output terminal Dout of each circuit block. Incidentally FIG. 10 also shows each of the nodes Node_A, Node_B, Node_D-Node_F, eread, MX, oread1, and oread2 for the explanation of operations that is to be described hereinbelow.

As a configuration other than that described above, TG circuits be and ce may be eliminated from circuit block LS6 and Node_A and Node_B may be directly connected, and regarding circuit block LS7 as well, TG circuits bo and co may be similarly eliminated and the output terminal of TG circuit ao may be connected directly to the input terminal of TG circuit do. In this case, the values of data RD6 and RD7 continue to be outputted from data output terminals Dout of circuit blocks LS6 and LS7, respectively.

Figure 11:
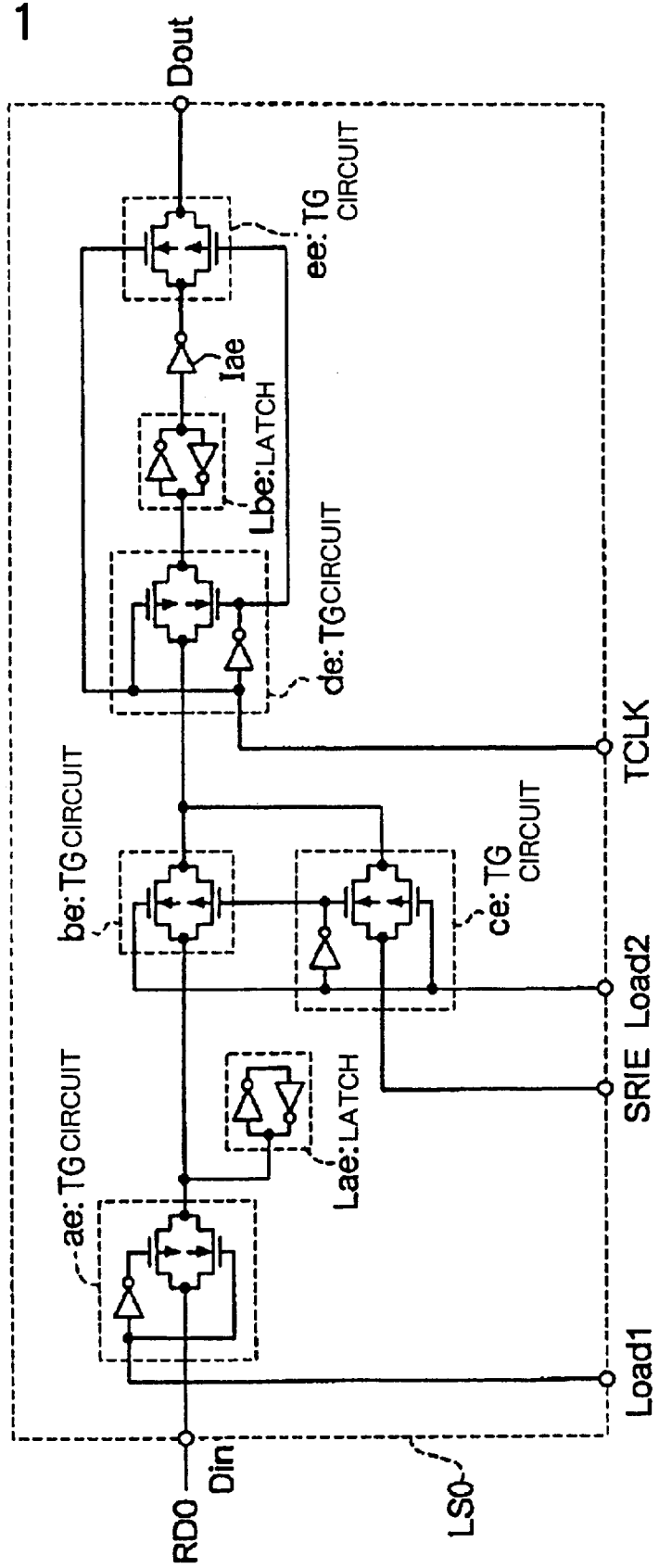
FIG. 11 is a circuit diagram showing details of the configuration of the even-side circuit blocks that form a part of the parallel-serial conversion circuit in the semiconductor memory device according to the present embodiment.
Figure 12:
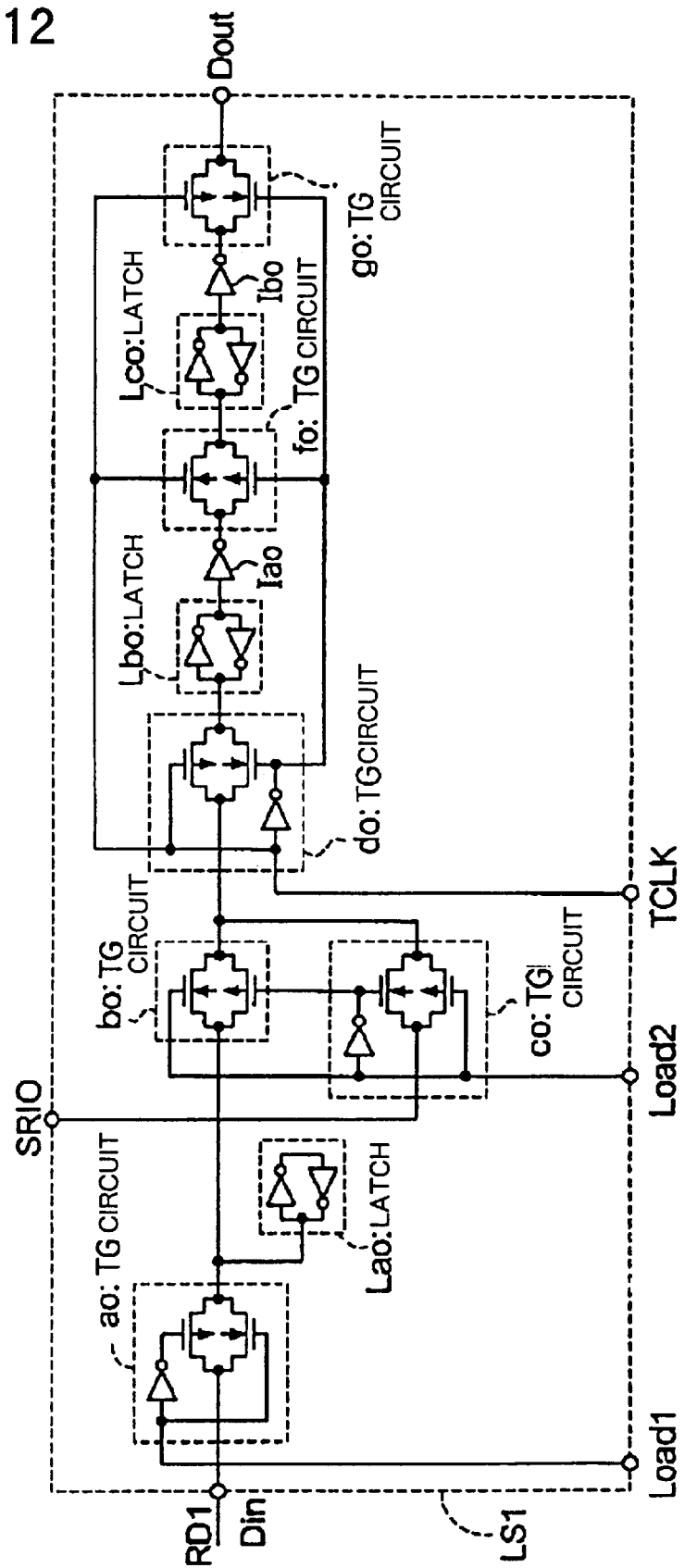
FIG. 12 is a circuit diagram showing details of the configuration of the odd-side circuit blocks that form a part of the parallel-serial conversion circuit in the semiconductor memory device according to the present embodiment.

Next, FIG. 11 and FIG. 12 each show in greater detail the example of the configuration of circuit blocks LS0 and LS1 shown in FIG. 10, and constituent elements identical to those shown in FIG. 10 are given the same reference numerals. Explanation is first given regarding circuit block LS0 shown in FIG. 11. TG circuit ae is made up by a typical transfer gate made up by an n-channel and p-channel transistor pair and an inverter for inverting load signal Load1 that is received at its own control terminal. Load signal Load1 and its inverted signal are each supplied to the gate terminals of the n-channel transistor and the p-channel transistor, respectively.

TG circuits ce and de have the same configuration, but since the control terminals of these circuits have inverted input that is the reverse of TG circuit ae, the n-channel transistor and the p-channel transistor are the reverse of the configuration of TG circuit ae. TG circuits be and ee share inverters with TG circuits ce and de, respectively, and therefore have a configuration in which the inverter is omitted from the configuration of TG circuit ae. Other than these points, latches Lae and Lbe both have a loop configuration in which two inverters are in cascade connection.

Next, regarding circuit block LS1 shown in FIG. 12, TG circuit ao, latch Lao, TG circuit bo, TG circuit co, TG circuit do, and latch Lbo all have exactly the same configuration as the corresponding constituent elements in circuit block LS0 shown in FIG. 11. In addition, TG circuit fo and latch Lco have the same configuration as TG circuit ee and latch Lbe, respectively, shown in FIG. 11. Finally, TG circuit go has the same configuration as TG circuit do with the exception that an inverter is omitted from the configuration of TG circuit go because TG circuit go and TG circuit do share an inverter.

The operation of parallel-serial conversion circuit resulting from the above-described configurations is next described in detail. Explanation is first presented regarding the operation in through mode with reference to the timing chart of FIG. 13, following which the operation in latch mode is explained with reference to the timing chart of FIG. 14. In the following explanation, moreover, the values of data RD0–RD7 are assumed to be "D0"–"D7," respectively. In addition, the signal waveforms of each of the nodes shown in FIG. 13 or FIG. 14 are for the nodes in circuit block LS0 or circuit block LS1 of circuit blocks LS0–LS7.

(a) Operation in Through Mode

Figure 13:
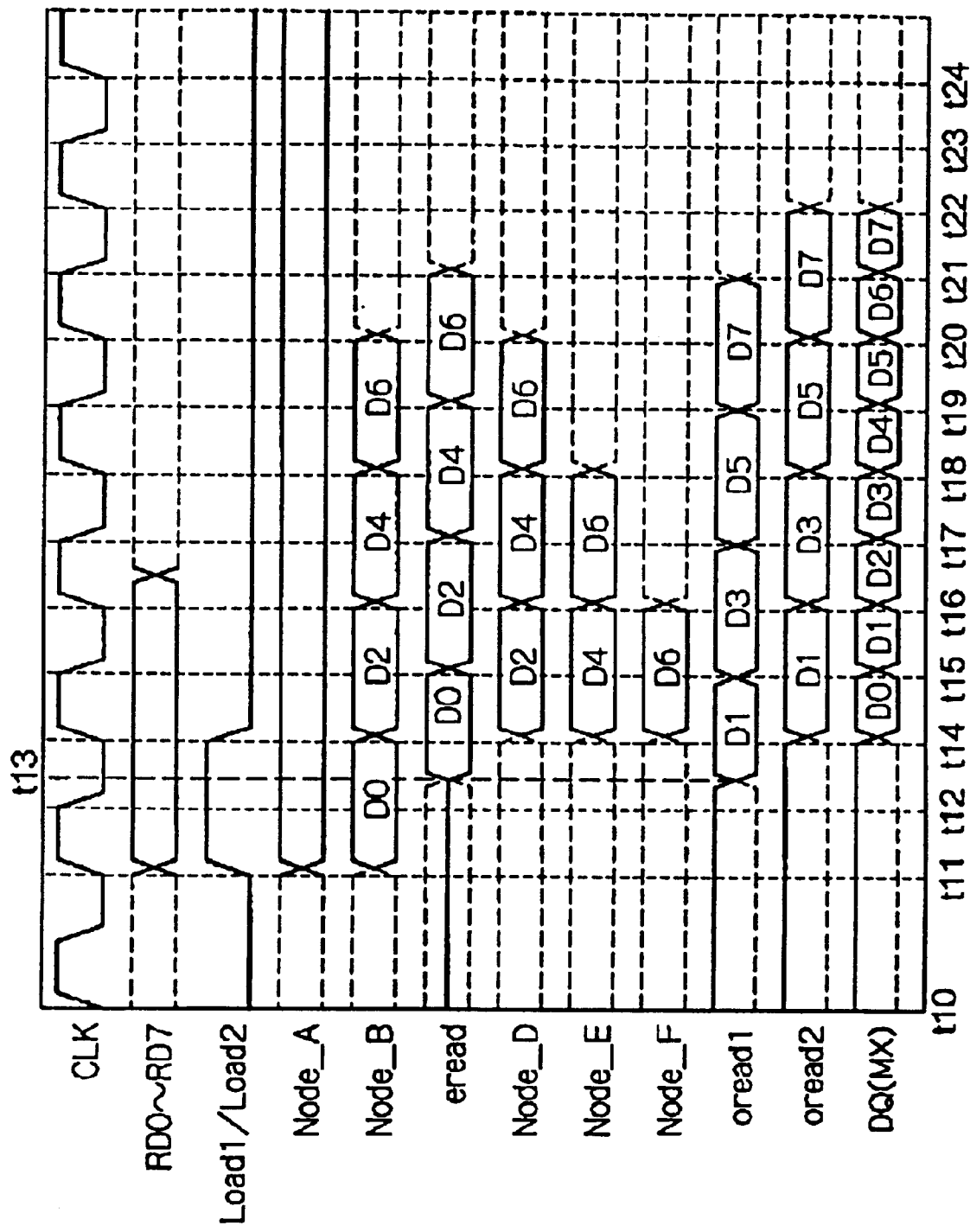
FIG. 13 is a timing chart showing the operation in the through mode of the parallel-serial conversion circuit in the semiconductor memory device according to the present embodiment.
Figure 14:
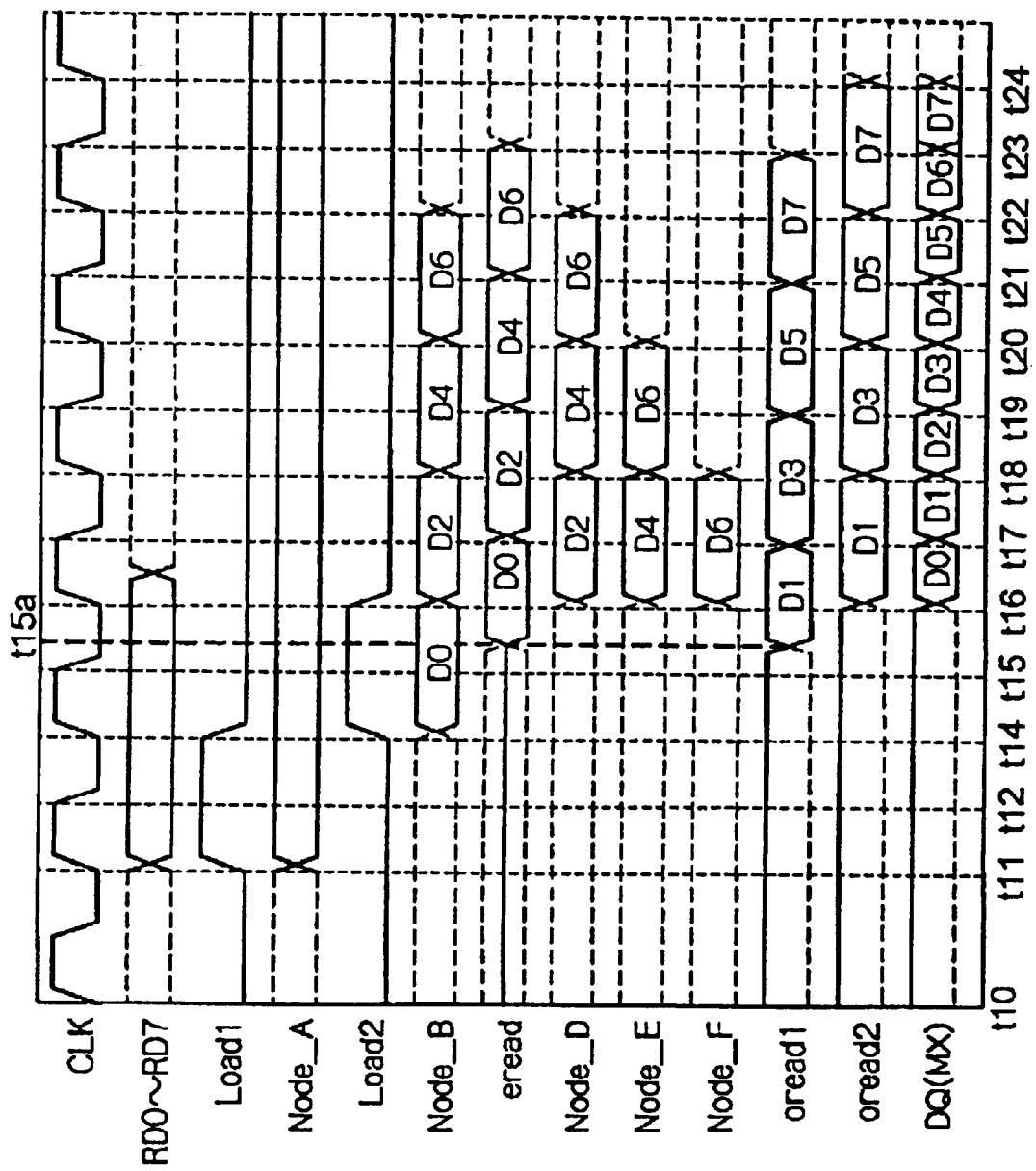
FIG. 14 is a timing chart showing the operation in the latch mode of the parallel-serial conversion circuit in the semiconductor memory device according to the present embodiment.

It is first assumed that both load signals Load1 and Load2 at time t10 shown in FIG. 13 are at "L" level. The eight bits of parallel data that have been read from the memory cell arrays are first set in each of the stages of the shift register that makes up the parallel-serial conversion circuits. As a result, load signals Load1 and Load2 are simultaneously made "H" level at the time of the rise of basic clock CLK at time t11. TG circuits ae and be in circuit block LS0 therefore enter a conductive state, and data RD0 are both latched in latch Lae and supplied from Node_A and through TG circuit be to Node_B corresponding to the input terminal of TG circuit de.

Since load signal Load2 is at "H" level at this time, TG circuits ce and co in each circuit block enter a nonconductive state, causing shift data input terminal SRIE to be cut off from TG circuit de or shift data input terminal SRIO to be cut off from TG circuit do. In FIG. 13, the value of data RD0 is shown to become "D0" immediately following time t11, but the value of data RD0 is not necessarily established at this time. In other words, it is only necessary that the value of data RD0 be established by the time load signals Load1 and Load2 simultaneously fall, be taken into latch Lbe, and reach the input terminal of TG circuit ee during the time that basic clock CLK is at "L" level. The same holds true for data RD2, RD4, and RD6.

However, in regard to only the read path of data RD0, which corresponds to bit 0, not only is the distance long from the output terminal of inverter Iae to the input terminal of TG circuit ee, which is arranged in the vicinity of input/output pad 10, but the wiring capacitance is large, and this path consequently has a proportionally greater load than the read paths of each of the data of bit 1–bit 7. Accordingly, if the data of bit 0 are not confirmed as quickly as possible, the data of bit 0 may not be in time for the change of TG circuit ee to a conductive state at the rise of basic clock CLK and may not be outputted to node MX. The data of bit 0 that are read from the memory cell arrays therefore must be transferred as far as node eread as quickly as possible.

Next, TG circuit de enters a conductive state when basic clock CLK falls at time t12 and the data of Node_B are latched by latch Lbe. Latch Lbe outputs the inverted data of the latched data to inverter Iae, and inverter Iae again inverts this inverted data and then supplies the result to the input terminal of TG circuit ee. As a result, the value "D0" of data RD0 appears at Node eread at time t13. The above-described operations are also carried out in circuit blocks LS2, LS4, and LS6, and as a result, by time t14, the values "D2," "D4,"

and "D6" of data RD2, RD4, and RD6, respectively, are both taken in by latch Lbe in these circuit blocks and these values are each outputted to node eread of each of the circuit blocks.

Next, when basic clock CLK rises at time t14, TG circuits de in the even circuit blocks enter a nonconductive state, whereby change in the data of Node_B that is caused by a preshift operation described hereinbelow does not influence the held content of latch Lbe. The preshift operation here mentioned is as follows: At the time data move to Node_B, the data are still not latched at latch Lbe, and the operation up to the movement of data to Node_B of the next section is therefore defined as a "preshift operation" for the sake of convenience and is to be distinguished from the shift operation up to latch Lbe of the next section. This holds true for the odd circuit blocks as well, the operation until data are moved to input terminal of TG circuit do of the next section being defined as a "preshift operation," and the operation until latching at latch Lbo of the next section being defined as a "shift operation".

At this time, moreover, TG circuit ee enters a conductive state, whereby the value "D0" of data RD0 at Node eread passes by way of output buffer OB and input/output pad 10 to be outputted out of the semiconductor memory device as output DQ. The above-described operations are carried out similarly in circuit blocks LS2, LS4, and LS6, the values of data RD2, RD4, and RD6 being outputted to Node_D, Node_E, and Node_F, respectively, at the same time t14.

Returning both load signals Load1 and Load2 to the "L" level at this same time t14 or immediately before switches the configuration to a form in which a shift operation is possible in the shift register. In other words, in circuit block LS0, not only does TG circuit ae enter a nonconductive state and latch Lae hold the value of data RD0, but TG circuit be enters a nonconductive state and TG circuit ce enters a conductive state, whereby the value "D2" of Node_D is supplied through shift data input terminal SRIE and TG circuit ce to Node_B of circuit block LS0, thereby carrying out the preshift operation. Since the same preshift operation is carried out in circuit blocks LS2, LS4, and LS6, Node_B of each of these circuit blocks becomes "D4," "D6," and fixed value "0," respectively.

When basic clock CLK next falls at time t15, the value "D2" that is outputted from TG circuit ce to Node_B in circuit block LS0 passes through TG circuit de and is taken into latch Lbe, and further, is outputted by way of inverter Iae to Node eread, which is the input terminal of TG circuit ee. This shift operation is also carried out in the same way in the other circuit blocks LS2, LS4, and LS6, whereby the above-described "D4," "D6," and fixed value "0," which are the values of Node_B, are taken in by latch Lae in these circuit blocks.

Subsequent operation following time t16 is equivalent to the operation from time t14 to t16. Specifically, when basic clock CLK rises at time t16, the value "D2" of Node eread is outputted from data output terminal Dout in circuit block LS0 and is outputted out of the semiconductor memory device by way of output buffer OB and input/output pad 10 as output DQ. At the same time t16, a change occurs in the output from the data output terminals Dout of circuit blocks LS2 and LS4, and the values "D4" and "D6" of Nodes eread are outputted from Node_D and Node_E, respectively.

In circuit block LS0, the value "D4" of Node_D from the preceding section, circuit block LS2, is supplied to Node_B of the same circuit block LS0, and the preshift operation is carried out. Similarly, in circuit block LS2, the value "D6" of Node_E from the preceding section, circuit block LS4, is supplied to Node_B of the same circuit block LS2, and the preshift operation is carried out. Next, when basic clock CLK falls at time t17, in circuit block LS0 the value "D4" of Node_B is taken into Latch Lbe and the inverted data of this value is outputted, inverted again at inverter Iae, and then supplied to Node eread. In circuit block LS2 as well, the value "D6" of Node_B is obtained in Node eread by the same shift operation.

In circuit block LS0, when basic clock CLK rises at time t18, the value "D4" of Node eread is outputted from data output terminal Dout, and finally outputted out of the semiconductor memory device. At the same time t18, moreover, change also occurs in the output of data output terminal Dout of circuit block LS2, and the value "D6" is outputted from Node_D. In circuit block LS0, the value "D6" of Node_D from circuit block LS2 is supplied to Node_B, and the preshift operation is carried out. Next, in circuit block LS0, when basic clock CLK falls at time t19, the value "D6" of Node_B is taken into latch Lbe, the inverted data of this value are outputted, inverted again at inverter Iae, and then outputted to Node eread. When basic clock CLK rises at time t20, the value "D6" of Node eread is outputted from data output terminal Dout of circuit block LS0 and finally outputted outside the semiconductor memory device.

The above-described operations are not only carried out in the even circuit blocks, but are carried out in generally the same manner in the odd circuit blocks. First, when load signals Load1 and Load2 both become "H" level at time t11, the values of data RD1, RD3, RD5, and RD7 are transferred as far as the input terminals of TG circuits do in circuit blocks LS1, LS3, LS5, and LS7, and the preshift operation is carried out. Since basic clock CLK is at the "H" level at this time, the values of these data are taken in by latches Lbo in the above-described circuit blocks and the shift operation is carried out at the time basic clock CLK subsequently becomes "L" level at time t12.

The values of data RD1, RD3, RD5, and RD7 need not be established at this point in time. In other words, it is only necessary that the values of data RD1, RD3, RD5, and RD7 be taken in into latch Lbo, pass through inverter Iao, and reach the input terminal of TG circuit fo while load signals Load1 and Load2 are both at "H" level and moreover while basic clock CLK is at "L" level. In this case, TG circuit fo is arranged close to data input terminal Din rather than to data output terminal Dout. As a result, the distance to the input terminal of TG circuit fo is not particularly long in the odd circuit blocks, in contrast to circuit block LS0, and the need for timely handling is not as demanding as for data RD0.

Thus, when basic clock CLK falls at time t12, data that are outputted from TG circuit bo in, for example, circuit block LS1 first pass through TG circuit do and are both taken into latch Lbo and supplied to, the input terminal of TG circuit fo by way of inverter Iao. As a result, the value "D1" of data RD1 appear in Node oread at time t13. Next, when basic clock CLK rises at time t14, not only is the value "D1" at Node oread1 passed through TG circuit fo and taken into latch Lco, but the inverted data of this value are again inverted at inverter Ibo and finally supplied to the input terminal of TG circuit go. As a result, the value of Node oread2 becomes "D1" as shown in the figure.

When basic clock CLK subsequently falls at time t15, TG circuit go enters a conductive state, whereby the value "D1" of Node oread2 is sent to Node MX and outputted out of the semiconductor memory device through output buffer OB and input/output pad 10 as output DQ. The above-described operations from time t11 to t16 are carried out in the same manner in circuit blocks LS3, LS5, and LS7, whereby the values "D3," "D5," and "D7" of data RD3, RD5, and RD7 are outputted from the data output terminals Dout of these circuit blocks at the same time t15.

Since load signals Load1 and Load2 have both fallen at the preceding time t14, a one-bit shift operation is carried out among the odd circuit blocks as was carried out among the even circuit blocks. In other words, although not shown in the figure, for example, the value "D3" of Node oread1 appears at Node oread2 in circuit block LS3 when basic clock CLK rises at the same time t14. When basic clock CLK subsequently falls at time t15, the value "D3" is outputted from the data output terminal Dout of circuit block LS3. This value "D3" passes through shift data input terminal SRIO, TG circuit co, and TG circuit do of circuit block LS1 and is taken in by latch Lbo, and furthermore, the inverted data of this value are again inverted by inverter Iao and becomes the value of Node oread1. The same operations are carried out in circuit blocks LS3, LS5, and LS7, and the values of Node oread1 become "D5," "D7," and fixed value "0".

The subsequent operations following time t16 are based on the operations during the period from time t12 to time t16. First, in circuit block LS1, when basic clock CLK rises at time t16, the value "D3" of Node oread1 passes through TG circuit fo and is taken in by latch Lco, then passes through inverter Ibo whereby the value of Node oread2 becomes "D3." Then, when basic clock CLK falls at time t17, the value of Node oread2 is outputted out of the semiconductor memory device via output buffer OB and input/output pad 10 as output DQ. The same operations are also carried out in circuit blocks LS3 and LS5, and the values "D5" and "D7" are outputted from the data output terminals Dout of the respective circuit blocks.

Then, at the same time t17, these values "D5" and "D7" are supplied to shift data input terminals SRIO in the circuit blocks LS1 and LS3, respectively, of the next section, taken into latch Lbo, pass through inverter Iao, and transferred as far as Node oread1. Next, in circuit block LS1, when basic clock CLK rises at time t18, the value "D5" of Node oread1 is taken in by latch Lco and passes through inverter Ibo, whereby the value of Node oread2 also becomes "ID5." When basic clock CLK subsequently falls at time t19, the value "D5" of Node oread2 is finally outputted out of the semiconductor memory device as output DQ.

The same operation occurs in circuit block LS3, and the value "D7" is therefore outputted from data output terminal Dout of that circuit block at the same time t19. This value "D7" is supplied to shift data input terminal SRIO of the next section, circuit block LS1, the data are taken in by latch Lbo of circuit block LS1, pass through inverter Iao, and appear in Node oread1. Next, in circuit block LS1, when basic clock CLK rises at time t20, the value "D7" of Node oread1 is taken in by latch Lco and passes through inverter Ibo, whereby the output of Node oread2 also becomes "D7." When basic clock CLK subsequently falls at time t21, the value "D7" of Node oread2 is finally outputted out of the semiconductor memory device as output DQ.

As described in the foregoing explanation, data from bit 0 to bit 7 are outputted alternating between even and odd in synchronization with the rises and falls of basic clock CLK. In this case, even data that are read from memory cell array 11U$e$ pass through data amplifier 17U$e$, TG circuit ae, TG circuit be, TG circuit de, latch Lbe, and inverter Iae and reach as far as the input terminal of TG circuit ee during the time that load signals Load1 and Load 2 are both activated and, moreover, basic clock CLK is at "H" level. Odd data that are read from memory cell array 11U$o$, on the other hand, pass through data amplifier 17U$o$, TG circuit ao, TG circuit bo, TG circuit do, latch Lbo, inverter Iao and arrive at the input terminal of TG circuit fo under the same time conditions.

Essentially, the data of bit 0 must reach the input terminal of TG circuit ee that is arranged in the vicinity of input/output pad 10 (see FIG. 2) by the time that basic clock CLK rises at time t14. In contrast, the data of bit 1 need only reach as far as the input terminal of TG circuit fo, which is arranged closer to data input terminal Din than TG circuit ee, by the time of the above-described rise. The reason for this difference in the length of the read path is the demand for maximum speed in reading bit 0 in the through mode. Thus, as described in the foregoing explanation, a sufficient timing margin can be secured by reading data of even bits from the memory cell array that is arranged in the vicinity of the data amplifier and the input/output pad.

(b) Operation in the Latch Mode

In FIG. 14, signal names and times that appear in FIG. 13 are given the same signal names and times. In this case as well, it is assumed that load signals Load1 and Load2 are both at "L" level at time t1O.

First, when basic clock CLK rises at time t11, load signal Load1 rises and becomes the "H" level, whereby data RD0–RD7 are taken into latch Lae (in the case of even data) or latch Lao (in the case of odd data), as explained in the section regarding the through mode.

Since load signal Load2 remains at the "L" level at this time, data that are set in latches Lae and Lao are not transferred to the input terminal of TG circuits de and do. Next, when basic clock CLK rises at time t14, not only is load signal Load1 lowered to return to the "L" level, but crossing this, load signal Load2 is raised. As a result, not only do latches Lae and Lao halt the operation of taking in data and begin holding data, but the data held by these latches are supplied to the input terminals of TG circuits de and do, whereby, for example, the value "D0" of data RD0 appears in Node_B in circuit block LS0.

When basic clock CLK subsequently falls at time t15, the data that have been supplied to the input terminals of TG circuits de and do, respectively, are taken in by latches Lbe and Lbo, pass through inverters Iae and Iao, and are supplied to the input terminals of TG circuits ee and fo. As a result, at time t15$a$, the value of Node eread in circuit block LS0 becomes "D0," and the value of Node oread1 in circuit block LS1 becomes "D1." If basic clock CLK rises at time t16, load signal Load2 is lowered to return to the "L" level. As a result, subsequent operations are the same as operations during through mode, and operations are carried out entirely the same from the time t14 shown in FIG. 13.

As described hereinabove, in latch mode, load signal Load1 is made effective and even and odd data are once taken into latches Lae and Lao, respectively, following which load signal Load2 is made effective and these data are transmitted to latches Lbe and Lbo. When basic clock CLK subsequently rises, not only are even data outputted as output DQ, but on the odd side, the data of latch Lbo are further transmitted to latch Lco. Then, at the next fall of basic clock CLK, the odd data that are held in latch Lbo are outputted as output DQ. The data from bit 0 to bit 7 are alternately outputted out of the semiconductor memory device by repeating this operation four times.

In latch mode, the even data and odd data that are stored in the memory cell arrays should be read as far as the input terminals of TG circuits be and bo that are arranged in the vicinity of data input terminals Din of each of the circuit blocks LS0–LS7. The read path of any of bit 0–bit 7 in latch mode is therefore shorter than the read path of bit 0 in through mode, and there is no particular timing requirement that bit 0 be read first, as is the case in through mode. In addition, although the distance from the output terminal of TG circuit de to the input terminal of TG circuit ee is longer on the even side than on the odd side, it is not as long as the read path of bit 0 in through mode, and since data need only be transferred within the time interval of half the period of basic clock CLK (for example, within the interval of time t14 to t15 shown in FIG. 14), there is a sufficient timing margin.

(3) Multiplexer and Selectors (a) First Configuration

Figure 15:
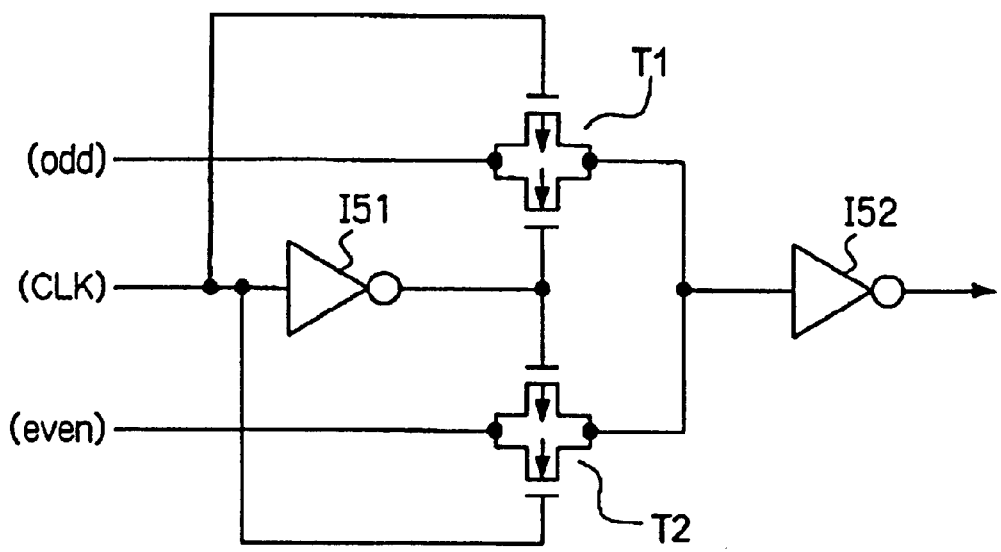
FIG. 15 is a circuit diagram showing details of the first configuration of the multiplexer and selector in the semiconductor memory device according to the present embodiment.

FIG. 15 shows a first example of the configuration of multiplexer 20 that is shown in FIG. 2. Selectors 19e and 19o may also be realized by the same configuration as multiplexer 20. In FIG. 15, reference numeral I51 is an inverter for inverting basic clock CLK, the input side of this inverter being connected with a supply signal line for basic clock CLK (hereinbelow referred to as "clock supply line") and its output side being connected to TG-T1 and TG-T2, which are transfer gates.

TG-T1 is a transfer gate in which a p-channel transistor and n-channel transistor are connected together as shown in the figure, the gate electrode of the p-channel transistor being connected to the clock supply line, and the gate electrode of the n-channel transistor being connected to the output side of inverter I51. TG-T2 is a similar transfer gate, but the gate electrode of the n-channel transistor is connected to the clock supply line and the gate electrode of the p-channel transistor is connected to the output side of inverter I51.

In the case of multiplexer 20, the input side of TG-T1 is connected to a data line that supplies the odd data outputted by selector 19o (hereinbelow referred to as "odd data line"), and the input side of TG-T2 is connected to a data line that supplies even data outputted by selector 19e (hereinbelow referred to as "even data line"). On the other hand, the output sides of TG-T1 and TG-T2 are both connected to the input of inverter I52. The output side of this inverter I52 is connected to input/output pad 10 shown in FIG. 2, and this inverter inverts and outputs the data received via TG-T1 or TG-T2.

The output of multiplexer 20 is the opposite phase of its input, but since even data are outputted to input/output pad 10 through selector 19e and multiplexer 20 as shown in FIG. 2, in the end, data of the same phase as the data that are applied to selector 19e are outputted to input/output pad 10. Similarly, since odd data are outputted to input/output pad 10 by way of selector 19o and multiplexer 20, the data that are finally outputted to input/output pad 10 are of the same phase as data that are applied to selector 19o.

By means of the above-described configuration, either the supplied even data or odd data are outputted from multiplexer 20 in accordance with basic clock CLK. More specifically, in this embodiment, even data are first supplied from the even data line to multiplexer 20, following which TG-T1 enters a nonconductive state and TG-T2 enters a conductive state when basic clock CLK rises. The data of bit 0, which are the first even data, are therefore outputted by way of inverter I52. Odd data are next supplied from the odd data line to multiplexer 20, following which TG-T1 enters a conductive state and TG-T2 enters a nonconductive state when basic clock CLK falls. The data of bit 1, which are the first odd data, are thus outputted by way of inverter I52. The even data line side and the odd data line side subsequently alternate in entering conductive states at the rises and falls of basic clock CLK, and the sequentially entered even data and odd data are thus alternately outputted.

(b) Second Configuration

Figure 16:
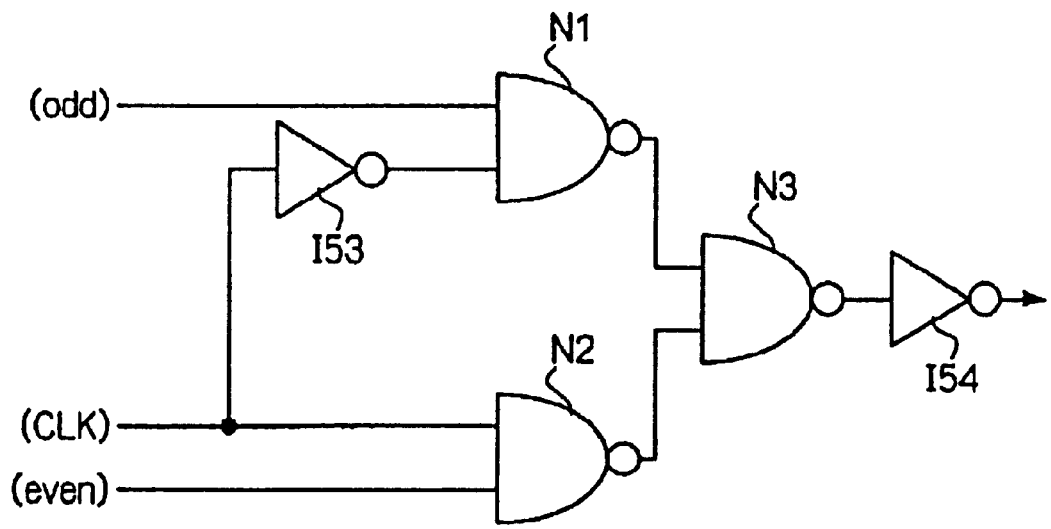
FIG. 16 is a circuit diagram showing details of the second configuration of the multiplexer and selector in the semiconductor memory device according to the present embodiment.

FIG. 16 shows a second example of the configuration of multiplexer 20. In this figure, reference numeral I53 is an inverter for inverting basic clock CLK, the input side of this inverter being connected to the clock supply line, and the output side being connected to one of the inputs of NAND circuit N1. The other input of NAND circuit N1 is connected to the odd data line, and the output is connected to one input of NAND circuit N3. In addition, the inputs of NAND circuit N2 are connected to the clock supply line and the even data line, and the output is connected to the other input of NAND circuit N3. Finally, the output of NAND circuit N3 is connected to the input of inverter I54, and the output of this inverter I54 is connected to input/output pad 10 shown in FIG. 2.

In the above-described configuration, even data are first supplied to multiplexer 20, and when basic clock CLK rises following the start of this supply, NAND circuit N2 inverts and outputs the even data, and NAND circuit N1 outputs "H" level regardless of the content of the odd data. The data of bit 0, which are the first even data to be supplied from the even data line, are thus outputted by way of NAND circuit N2, NAND circuit N3, and inverter I54. Odd data are then supplied to multiplexer 20, and when basic clock CLK subsequently falls, NAND circuit N1 inverts and outputs the odd data, and NAND circuit N2 outputs "H" level regardless of the content of the even data. The data of bit 1, which are the first odd data to be supplied from the odd data line, are thus outputted by way of NAND circuit N1, NAND circuit N3, and inverter I54. The even data line and the odd data line are subsequently selected alternately at the rise and fall of basic clock CLK, and the sequentially received even data and odd data are alternately outputted.

MODIFICATIONS (1) In a case in which memory cell arrays are activated as described in FIG. 4, twice as many sense amplifiers are simultaneously activated as in the prior art (refer to FIG. 3). In semiconductor memory devices that have been manufactured to date, the number of sense amplifiers that are simultaneously activated has also increased with increases in capacity. Thus, even if large-capacity semiconductor memory devices are taken into consideration, such as the 512 megabit and 1-gigabit semiconductor memory devices that are to become the mainstream, a doubling of the number of sense amplifiers that are simultaneously activated should not cause significant problems regarding product specifications. Nevertheless, it is possible that a reduction of current consumption will be desirable in some fields of application, and consideration must therefore be given to reducing the number of sense amplifiers that are activated simultaneously to the same level as in the prior art.

Figure 17:
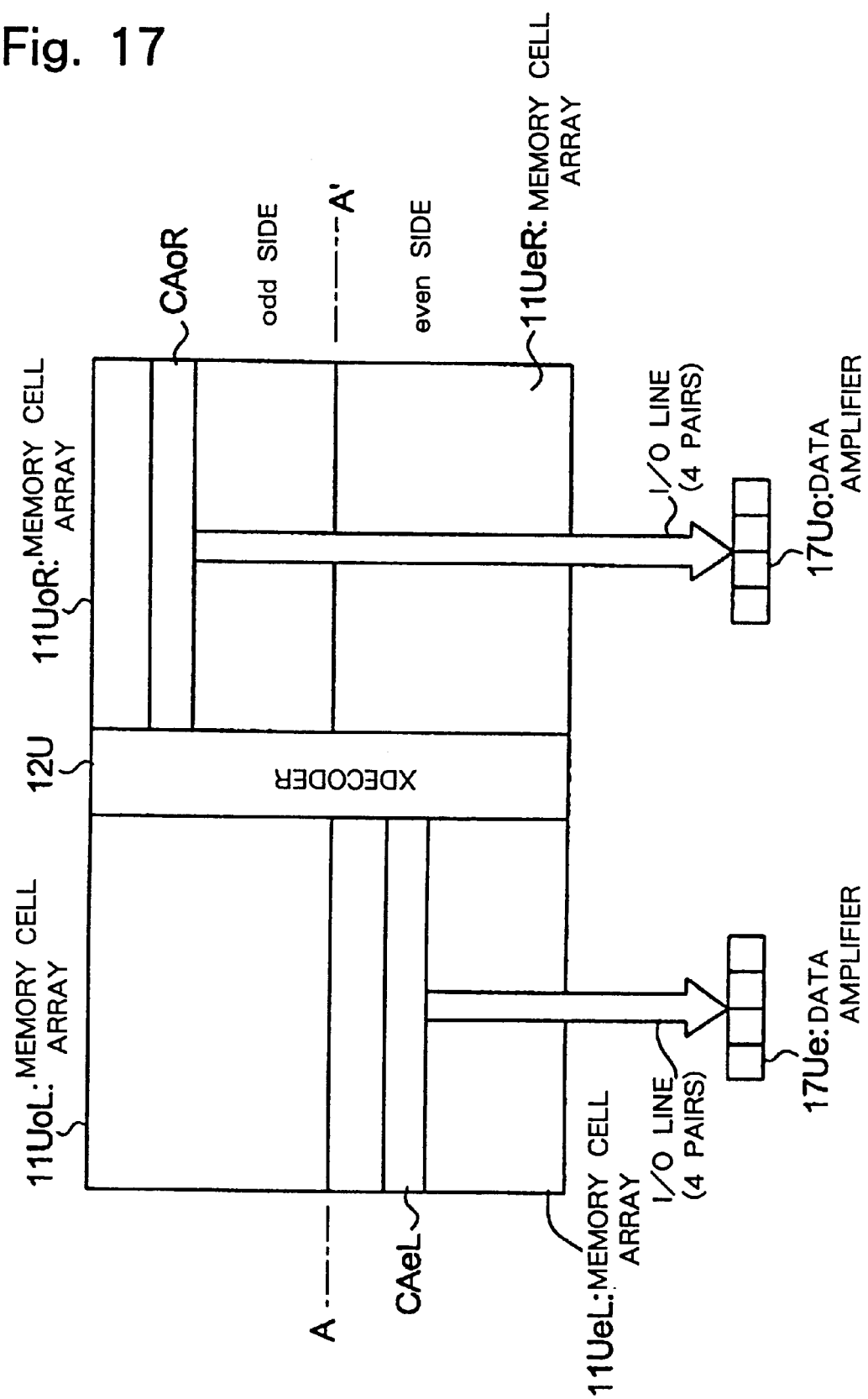
FIG. 17 is a block diagram showing the configuration of a modification that reduces by half the number of sense amplifiers that are simultaneously activated in the semiconductor memory device according to the present embodiment.

FIG. 17, which is based on FIG. 4, shows an example of the configuration of a semiconductor memory device for such a case, and constituent elements that are equivalent to elements in FIG. 4 are identified by the same reference numerals. As shown in the figure, X-decoder 12U is arranged near the center of the memory sub-array in this example of a modification. X-decoder 12U thus serves as a boundary to divide memory cell array 11Uo into left and right memory cell arrays 11UoL and 11UoR and memory cell array 11Ue into left and right memory cell arrays 11UeL and 11UeR. X-decoder 12U decodes row addresses in order to activate only those sense amplifiers (not shown in the figure) that correspond to areas CAeL and CAoR in the even and odd memory cell arrays, respectively.

The wiring of I/O lines in this modification may be the same as in FIG. 4. In addition, although FIG. 17 shows a case in which even data and odd data are read from the same memory sub-array, a case of reading even data and odd data that straddle two memory sub-arrays is equivalent. In a case in which even data are read from the upper memory sub-array and odd data are read from the lower memory sub-array, for example, it is sufficient to activate only the area corresponding to area CAeL in the upper memory sub-array and only the area corresponding to area CAoR in the lower memory sub-array.

(2) In the above-described invention, explanation regarded cases in which even data are outputted before odd data, but the present invention may also be applied in cases in which odd data are outputted before even data. In such cases, the arrangement of the odd memory cell arrays and even memory cell arrays in each memory sub-array is switched such that the odd memory cell arrays are arranged close to the data amplifier.

(3) Although the number of bits that are received or outputted in a single burst was eight in the above-described invention, the invention is not limited to eight bits and any number of bits may be used.

(4) The positions in which the serial-parallel conversion circuit, write amplifier, data amplifier, and parallel-serial conversion circuit are arranged may be an area on the X-decoder side rather than an area on the Y-decoder (not shown) side in the above-described invention as shown in FIG. 2. In such a case, the memory cell array is divided horizontally rather than vertically, the even memory cell array being arranged close to the X-decoder and the odd memory cell array being arranged far from the X-decoder.

(5) The above-described invention related to an example of the application to a DDR semiconductor memory device that receives and outputs serial data at the rises and falls of basic clock CLK. However, the present invention is of course not limited to a semiconductor memory device that receives and outputs data at this type of clock timing. For example, the present invention may also be applied to a SDR (Single Data Rate) semiconductor memory device that reads and writes even data at the rise of a particular basic clock CLK and reads or writes odd data at the next rise of basic clock CLK.

(6) Although the memory sub-array was divided into two parts in the above-described invention, the number of divisions need not be "two". For example, each memory sub-array may be divided into eight parts and thus be made up of eight memory cell arrays, one array for each bit, with the memory cell array for bit 0 being arranged closest to the data amplifier. Even in a case in which the memory sub-array is divided into two parts, however, there is no necessity for these divisions to be based on even and odd use. In other words, as long as bit 0, which must be outputted first, is stored in a memory cell array that is arranged closest to the data amplifier, the remaining bits 1–7 may be stored in any memory cell array. For example, it is possible for bits 0–3 to be stored in memory cell arrays 11U*e* and 11L*e*, and bits 4–7 to be stored in memory cell arrays 11U*o* and 11L*o*. When configured in this way, the circuits of the read system and write system, including such components as write amplifiers, data amplifiers, serial-parallel conversion circuits, parallel-serial conversion circuits, selectors, multiplexers, and demultiplexers, may be configured as appropriate depending on which bits are to be stored in each memory cell array according to the judgment of one knowledgeable in the art.

In the foregoing explanation, a memory sub-array that constitutes a semiconductor memory device in the present invention is divided into a plurality of memory cell arrays, and each of the bits of data of a plurality of bits that are read from these memory cell arrays are continuously outputted to the outside. At this time, in the invention as described in claim 2, the data bits that are to outputted first are stored in a first memory cell array that is arranged closer to the output means than other memory cell arrays. As a result, of the bits of data that are to be read in a burst, the read time of the first bit, which has the most stringent timing condition, can be made shorter than the read time of any of the other bits, thereby enabling higher speed of the semiconductor memory device overall.

In the invention according to claim 6, the first output line from the first memory cell array to the output means is shorter than other output lines from other memory cell arrays to the output means. The load capacity and time constant of output lines for transmitting data from memory cells to the output means can therefore be made smaller for the first output line than other output lines, reading of bits of the first burst can be made proportionally faster, and a timing margin can be ensured. In particular, since output lines tend to increase in length as the capacity of a semiconductor memory device increases, this effect is more marked with higher-capacity semiconductor memory devices. According to the inventions of claim 2 and claim 6, the complexity of the configuration of peripheral circuits such as the output means is not increased, even in comparison with a semiconductor memory device of the prior art, and it is therefore possible to produce semiconductor memory devices designed for higher speed without necessitating a large-scale circuit configuration. Furthermore, as in the invention described in claim 5, this is particularly effective in operation modes in which the data of bits that should be outputted to the outside first are transmitted "through" from memory cell arrays to the output terminal because the wiring for bits to be outputted first is longer.

In the invention as described in claim 3, a memory sub-array is made up by first and second memory cell arrays, and bits of data are read alternately from these two memory cell arrays, beginning with the first memory cell array, in which are stored the data of bits that are to be outputted first, and outputted to the outside continuously. Thus, for example, when reading is performed in eight-bit bursts from bit 0 to bit 7 for each address access, the memory sub-array is divided between a memory cell array for even data and a memory cell array for odd data. As a result, the time for reading from the memory cell array for even data can be reduced to half the time for reading from the memory cell array for odd data.

In the invention described in claim 7, the first output line and other output lines are constituted by hierarchical output lines made up by local output line and global output lines, the global output lines that make up the first output lines being shorter than the global output lines that make up the other output lines. Not only does the adoption of hierarchical output lines reduce wiring delay, but shortening the first output lines also reduces wiring delay, thereby enabling an even greater increase in speed.

In the invention according to claim 10, of the plurality of local output lines for transmitting, to the global output lines, data bits that are simultaneously outputted, the local output lines for transmitting bits of data that are to be outputted first are arranged closest to the output means. As a result, in a case in which, for example, data of even bits are stored in the first memory cell array and data of odd bits are stored in the other memory cell array in order to perform eight-bit burst output from bit 0 to bit 7, the global output lines corresponding to bit 0 that is to be outputted first can be made the shortest of the plurality of global output lines, thereby enabling an even greater increase in speed.

In the invention according to claim 16, each of the memory cell arrays are divided into a plurality of areas that are activated independently of each other; and when reading a plurality of bits of data, only the areas in which this plurality of bits of data are stored are simultaneously activated and prescribed bits of data are read. By thus dividing each memory cell array into, for example, two areas, the number of sense amplifiers that are simultaneously activated to read data from the memory cell arrays can be reduced by half.

This invention enables high-speed reading of the bits that are to be outputted first and enables a reduction in the current consumption of the entire semiconductor memory device.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. A semiconductor memory device provided with an output means that sorts into a prescribed order a plurality of bits of data that have been read from a memory sub-array having a plurality of memory cells and continuously outputs to the outside;

wherein the memory cells which store the first bits of data that are to be outputted are arranged such that said first bits of data are outputted to said output means in a shorter time than other bits of data that are simultaneously read.

2. A semiconductor memory device according to claim 1 wherein:

said memory sub-array is divided into a plurality of memory cell arrays;

of said plurality of bits of data, said first bits of data are stored in a first memory cell array of said plurality of memory cell arrays; and said first memory cell array is arranged closer to said output means than other memory cell arrays.

3. A semiconductor memory device according to claim 1 wherein:

said memory sub-array is constituted by a first memory cell array and a second memory cell array; and regarding the plurality of bits of data that are to be read simultaneously, said first bits of data are stored in said first memory cell array; the remaining bits of data are alternately stored in a prescribed order in said first and second memory cell arrays; and when outputted, each of said bits of data are alternately outputted from said first memory cell array and said second memory cell array and outputted continuously to the outside by said output means, with said first bits of data being output first.

4. A semiconductor memory device according to claim 3 wherein:

each of said bits of data that are alternately outputted from said first memory cell array and said second memory cell array are alternately outputted to the outside in synchronization with the rise and fall of clocks.

5. A semiconductor memory device according to claim 3 wherein:

said first bits of data are read from said first memory cell array and transmitted to an output terminal.

6. A semiconductor memory device according to claim 1 wherein:

the length of a first output line for reading from said memory sub-array the first bits of data of said plurality of bits of data and transmitting to said output means is shorter than the length of other output lines for transmitting to said output means said other bits of data that are simultaneously read.

7. A semiconductor memory device according to claim 6, wherein:

said, first output line and said other output lines are hierarchical output lines that are made up by: local output lines onto which are read bits of data that are stored in said memory cells; and global output lines for transmitting to said output means bits of data that have been read on to said local output lines; and the length of a global output line that makes up said first output line is shorter than the length of global output lines that make up said other output lines.

8. A semiconductor memory device according to claim 7 wherein:

said memory sub-array is made up by a plurality of memory cell arrays, each of said plurality of memory cell arrays is further made up by a plurality of memory cell plates; said local output lines are provided for each group of a prescribed number of memory cell plates that are arranged adjacent to each other; and said global output lines are arranged to lead from each said group of said local output lines to said output means.

9. A semiconductor memory device according to claim 7, wherein:

said memory sub-array is made up by a plurality of memory cell arrays, each of said plurality of memory cell arrays is further made up by a plurality of memory cell plates; said local output lines are provided for each of said plurality of memory cell plates; and said global output lines are arranged to lead from each of said local output lines to said output means.

10. A semiconductor memory device according to claim 7 wherein:

of said local output lines for transmitting to said global output lines bits of data that are simultaneously read, ones of said local output lines for transmitting the first bits of data are arranged closest to said output means.

11. A semiconductor memory device according to claim 10 wherein:

said memory sub-array is made up of a plurality of memory cell arrays, each of the plurality of memory cell arrays is further made up of a plurality of memory cell plates; said local output lines are provided for each group of a prescribed number of memory cell plates that are arranged adjacent to each other; and said global output lines are arranged to lead from each said group of said local output lines to said output means.

12. A semiconductor memory device according to claim 10 wherein:

said memory sub-array is made up of a plurality of memory cell arrays, each of the plurality of memory cell arrays is further made up of a plurality of memory cell plates; said local output lines are provided for each memory cell plate; and said global output lines are arranged to lead from each of said local output lines to said output means.

13. A semiconductor memory device provided with an output means that sorts into a prescribed order a plurality of bits of data that have been read from a memory sub-array having a plurality of memory cells and continuously outputs to the outside;

said memory sub-array is divided into a plurality of memory cell arrays, and when reading said plurality of bits of data that are to be read, only those areas in which said plurality of bits of data that are to be read are stored are activated and said plurality of bits of data are read.

14. A semiconductor memory device according to claim 13 wherein:

said semiconductor memory device is provided with a plurality of said memory sub-arrays and said plurality of bits of data that are to be read are stored in said plurality of memory cell arrays of said plurality of memory sub-arrays; and at the time of reading said plurality of bits of data, only memory sub-arrays in which said plurality of bits of data are stored are simultaneously activated and said plurality of bits of data are read.

15. A semiconductor memory device according to claim 13 wherein:

said plurality of bits of data that are to be read are stored in said memory cell arrays of a single said memory sub-array, and at the time of reading said plurality of bits of data, only memory cell arrays in which said plurality of bits of data are stored are simultaneously activated and said plurality of bits of data are read.

16. A semiconductor memory device according to claim 15 wherein:

each of said plurality of memory cell arrays is further divided into a plurality of areas that are independently activated, and at the time of reading said plurality of bits of data, only said areas of memory cell arrays in which are stored said plurality of bits of data are simultaneously activated and said plurality of bits of data are read.

17. A semiconductor memory device comprising:

a) at least first and second memory sub arrays forming a semiconductor memory having a plurality of memory cells, each sub-array having an output port and said semiconductor memory having a decoder for accessing bits in said sub-arrays and stored in said memory cells;

b) an output circuit connected to each of said output ports of each sub-array and connected to an output terminal, said output circuit receiving accessed bits transmitted from said memory cells to said output ports and sorting said accessed bits from said sub-arrays into a pre-scribed order;

c) wherein said accessed bits are stored in said at least first and second sub-arrays such that the first bit of a word is stored in a first bit memory cell having a relatively shorter transmission time from said first bit memory cell to one of said output ports as compared to a second bit of said word stored in a second bit memory cell and output to the other of said output ports.

* * * * *